United States Patent
Lee et al.

(10) Patent No.: US 12,048,154 B2
(45) Date of Patent: *Jul. 23, 2024

(54) MEMORY DEVICE AND MANUFACTURING METHOD THEREOF

(71) Applicant: MACRONIX International Co., Ltd., Hsinchu (TW)

(72) Inventors: Hong-Ji Lee, Taoyuan (TW); Tzung-Ting Han, Hsinchu (TW); Lo Yueh Lin, Hsinchu (TW); Chih-Chin Chang, New Taipei (TW); Yu-Fong Huang, Hsinchu (TW); Yu-Hsiang Yeh, Miaoli County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 382 days.

This patent is subject to a terminal disclaimer.

(21) Appl. No.: 17/344,661

(22) Filed: Jun. 10, 2021

(65) Prior Publication Data

US 2022/0399361 A1    Dec. 15, 2022

(51) Int. Cl.
*H10B 43/27* (2023.01)
*H10B 41/10* (2023.01)
*H10B 41/27* (2023.01)
*H10B 43/10* (2023.01)

(52) U.S. Cl.
CPC ............. *H10B 43/27* (2023.02); *H10B 41/10* (2023.02); *H10B 41/27* (2023.02); *H10B 43/10* (2023.02)

(58) Field of Classification Search
CPC ................................ H10B 43/27; H10B 43/20
See application file for complete search history.

(56) References Cited

U.S. PATENT DOCUMENTS

| | | | |
|---|---|---|---|
| 2018/0122906 A1* | 5/2018 | Yu | H10B 41/27 |
| 2018/0151497 A1 | 5/2018 | Makala et al. | |
| 2019/0229125 A1 | 7/2019 | Zhou et al. | |
| 2020/0126974 A1 | 4/2020 | Liu et al. | |
| 2020/0373321 A1* | 11/2020 | Kwak | H01L 23/528 |
| 2021/0036010 A1* | 2/2021 | Sim | H10B 43/10 |
| 2022/0199767 A1* | 6/2022 | Lee | H01L 29/0638 |

FOREIGN PATENT DOCUMENTS

| TW | 201732817 | 9/2017 |
|---|---|---|
| TW | 201937770 | 9/2019 |

OTHER PUBLICATIONS

"Office Action of Taiwan Counterpart Application", issued on Mar. 4, 2022, p. 1-p. 5.

* cited by examiner

*Primary Examiner* — Christopher A Johnson
(74) *Attorney, Agent, or Firm* — J.C. PATENTS

(57) ABSTRACT

A memory device includes a first stack structure, a second stack structure, a channel pillar, a storage layer, and a conductive pillar. The first stack structure includes a first insulating layer and a first conductive layer located on the first insulating layer. The second stack structure is located on the first stack structure and includes a plurality of second conductive layers and a plurality of second insulating layers which alternate with each other. The channel pillar penetrates through the second stack structure and extends to the first stack structure. The storage layer is located between the channel pillar and the first stack structure and between the channel pillar and the second stack structure. The conductive pillar is located in the first conductive layer and electrically connected to the first conductive layer and the substrate.

9 Claims, 21 Drawing Sheets

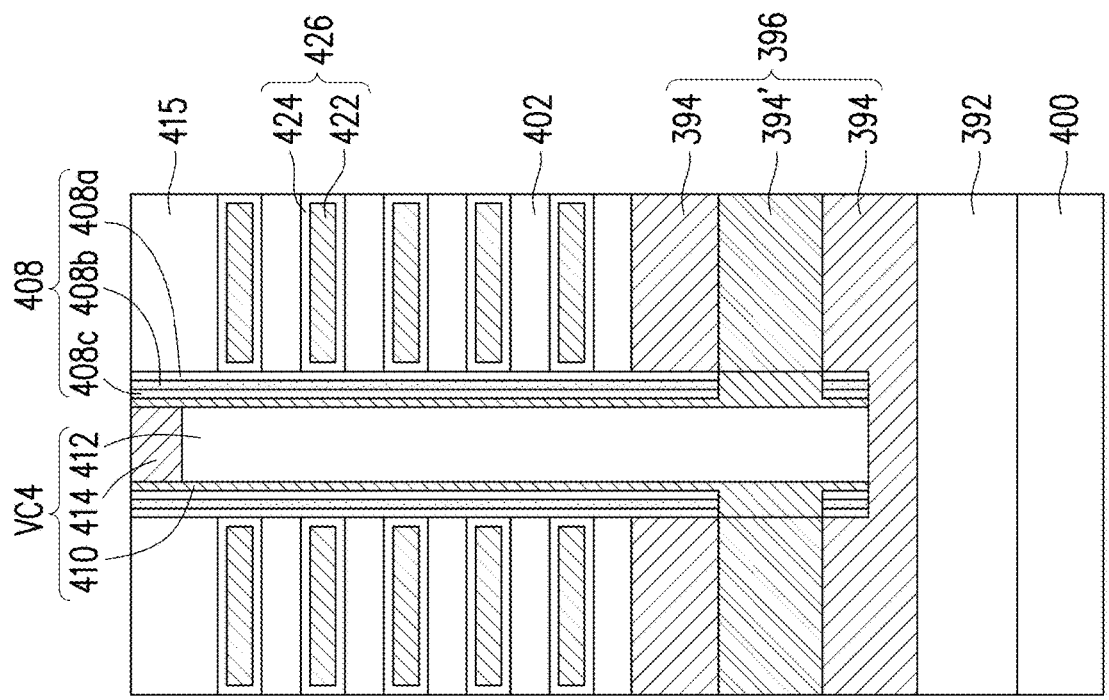
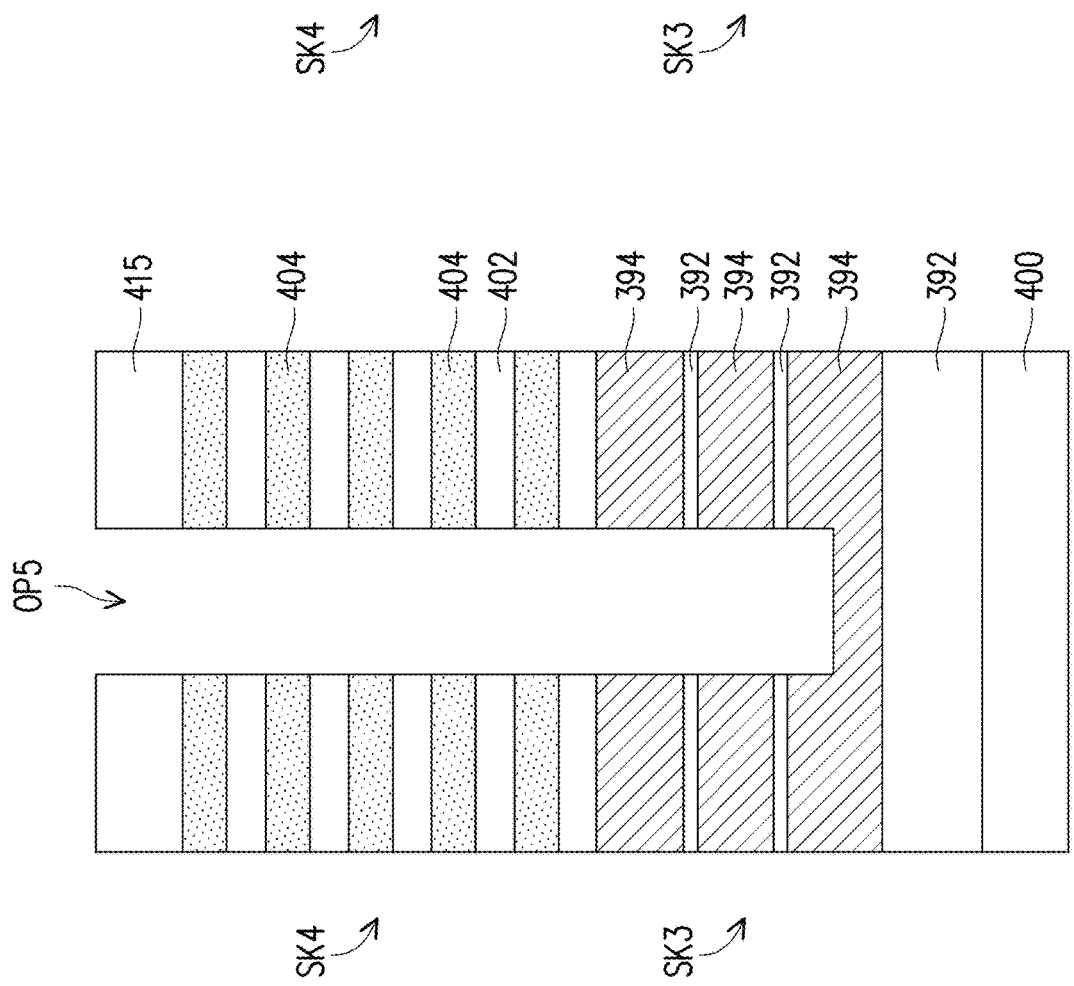
FIG. 4A
FIG. 4B

MEMORY DEVICE AND MANUFACTURING METHOD THEREOF

BACKGROUND

Technical Field

The embodiment of the disclosure relates to a semiconductor device and a manufacturing method thereof, and particularly, to a three-dimensional memory device and a manufacturing method thereof.

Description of Related Art

Since a non-volatile memory device (e.g., a flash memory) has the advantage that stored data does not disappear at power-off, it becomes a widely used memory device for a personal computer or other electronics equipment.

Currently, the flash memory array commonly used in the industry includes a NOR flash memory and a NAND flash memory. Since the NAND flash memory has a structure in which memory cells are connected together in series, degree of integration and area utilization thereof are better than those of the NOR flash memory. Thus, the NAND flash memory has been widely used in a variety of electronic products. Besides, to further enhance the degree of integration of the memory device, a three-dimensional NAND flash memory is developed. However, there are still some challenges associated with the three-dimensional NAND flash memory.

SUMMARY

An embodiment of the disclosure provides a memory device including a first stack structure, a second stack structure, a channel pillar, a storage layer, and a conductive pillar. The first stack structure includes a first insulating layer and a first conductive layer located on the first insulating layer. The second stack structure is located on the first stack structure and includes a plurality of second conductive layers and a plurality of second insulating layers which alternate with each other. The channel pillar penetrates through the second stack structure and extends to the first stack structure. The storage layer is located between the channel pillar and the first stack structure and between the channel pillar and the second stack structure. The conductive pillar is disposed in the first conductive layer and electrically connected to the first conductive layer and the substrate.

An embodiment of the disclosure provides a memory device including a stack structure, a top insulating layer, a channel pillar, a storage layer, a dielectric layer, and a contact. The stack structure is located on a substrate and includes a plurality of conductive layers and a plurality of insulating layers which alternate with each other. The top insulating layer is located on the stack structure. The channel pillar is located in the top insulating layer and the stack structure. The storage layer is located between the channel pillar and the plurality of conductive layers. The dielectric layer is located on the top insulating layer. The contact penetrates through the dielectric layer and the top insulating layer and is electrically connected to the channel pillar. A ratio of a thickness of the dielectric layer to a thickness of the top insulating layer is greater than 2.

An embodiment of the disclosure provides a method for manufacturing a memory device, including the following steps. A first stack structure is formed on a substrate, and the first stack structure includes a plurality of first conductive layers and a plurality of first insulating layers which alternate with each other. A conductive pillar is formed in the first stack structure so that one of the plurality of first conductive layers is grounded. A first tier of a second stack structure is formed on the first stack structure, and the first tier of the second stack structure includes a plurality of sacrificial layers and a plurality of second insulating layers which alternate with each other. A first opening is formed in the first tier of the second stack structure and the first stack structure. A sacrificial pillar is formed in the first opening, and the sacrificial pillar is electrically connected to the conductive pillar via the one of the first conductive layers and is thereby grounded. A second tier of the second stack structure is formed on the first tier of the second stack structure. A patterning process is performed to form a second opening in the second tier of the second stack structure, and the second opening exposes the sacrificial pillar. The sacrificial pillar is removed to expose the first opening. A storage layer and a channel pillar are formed in the first opening and the second opening. Part of the plurality of first insulating layers and part of the plurality of first conductive layers are replaced with a plurality of second conductive layers, so that the remaining plurality of first conductive layers and the plurality of second conductive layers form a source line.

In the embodiments of the disclosure, through the arrangement of the grounded conductive pillar and the selection of the etching gas of the over-etching process, it is possible to mitigate or solve problems such as misalignment and an excessively high etching rate of the unlanded area.

BRIEF DESCRIPTION OF THE DRAWINGS

FIG. 4A to FIG. 4G are schematic cross-sectional views of a method for manufacturing a three-dimensional memory device according to an embodiment of the disclosure.

DESCRIPTION OF THE EMBODIMENTS

Figure 1A:
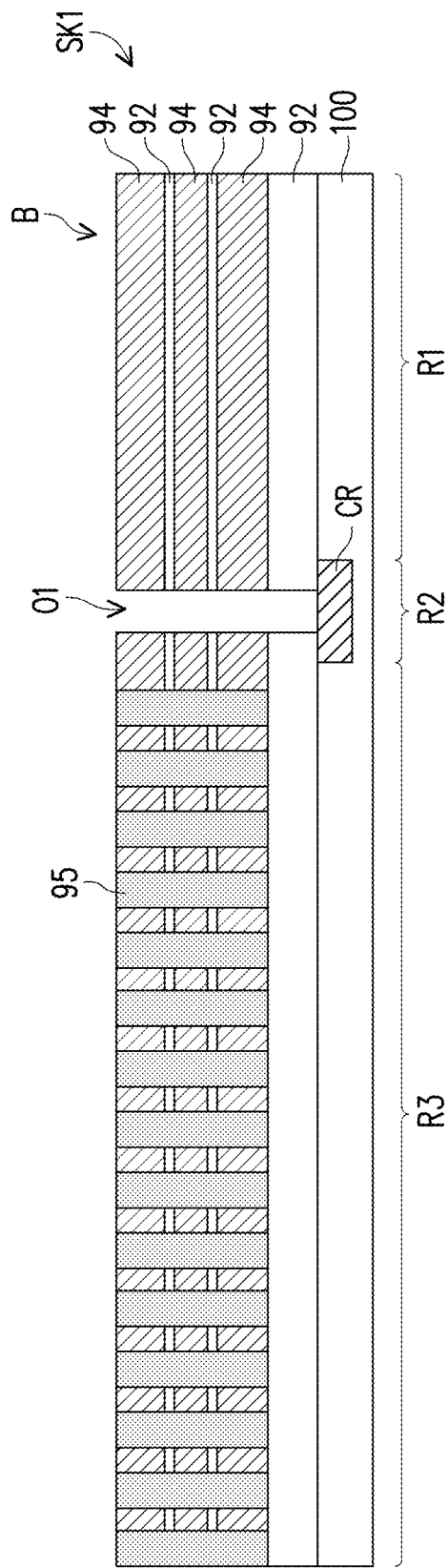
FIG. 1A to FIG. 1N are schematic cross-sectional views of a method for manufacturing a three-dimensional memory device according to an embodiment of the disclosure.
Figure 1B:
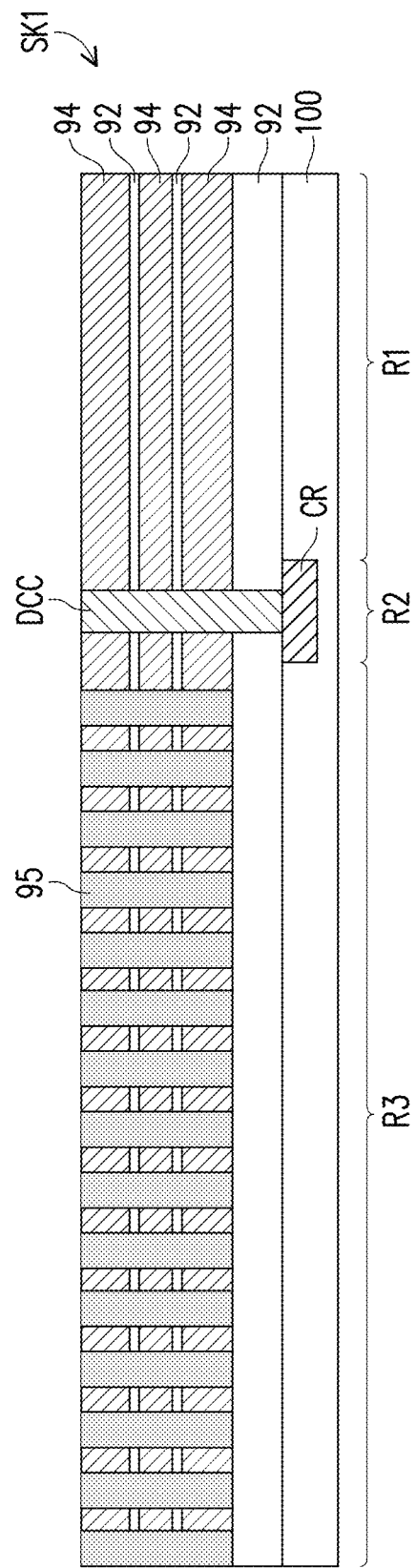
Figure 1C:
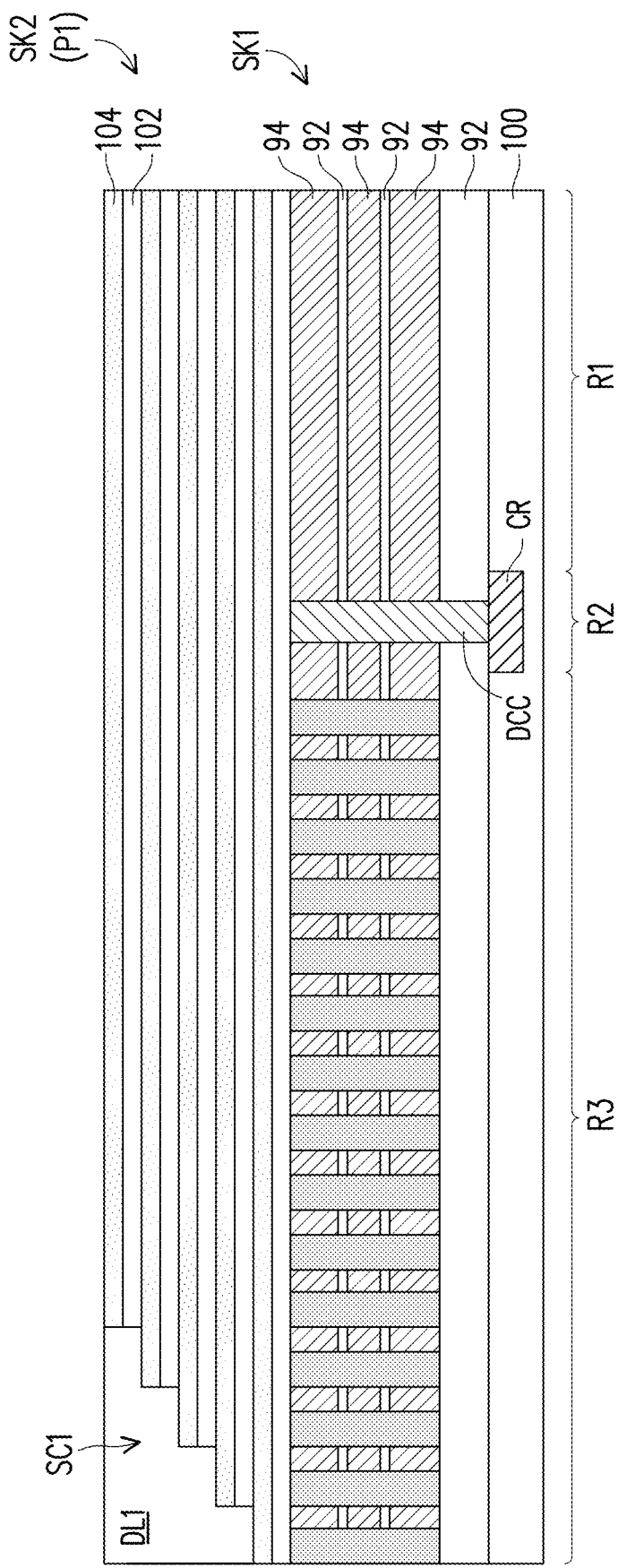
Figure 1D:
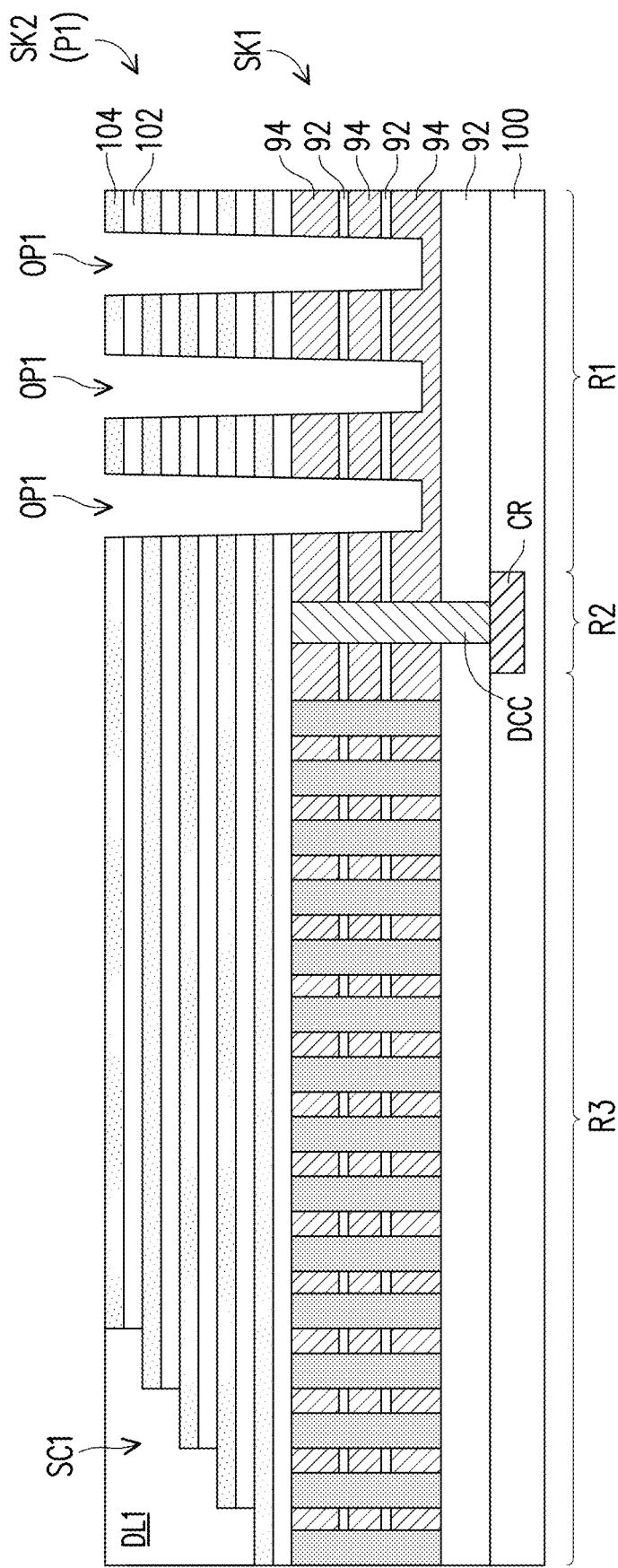
Figure 1E:
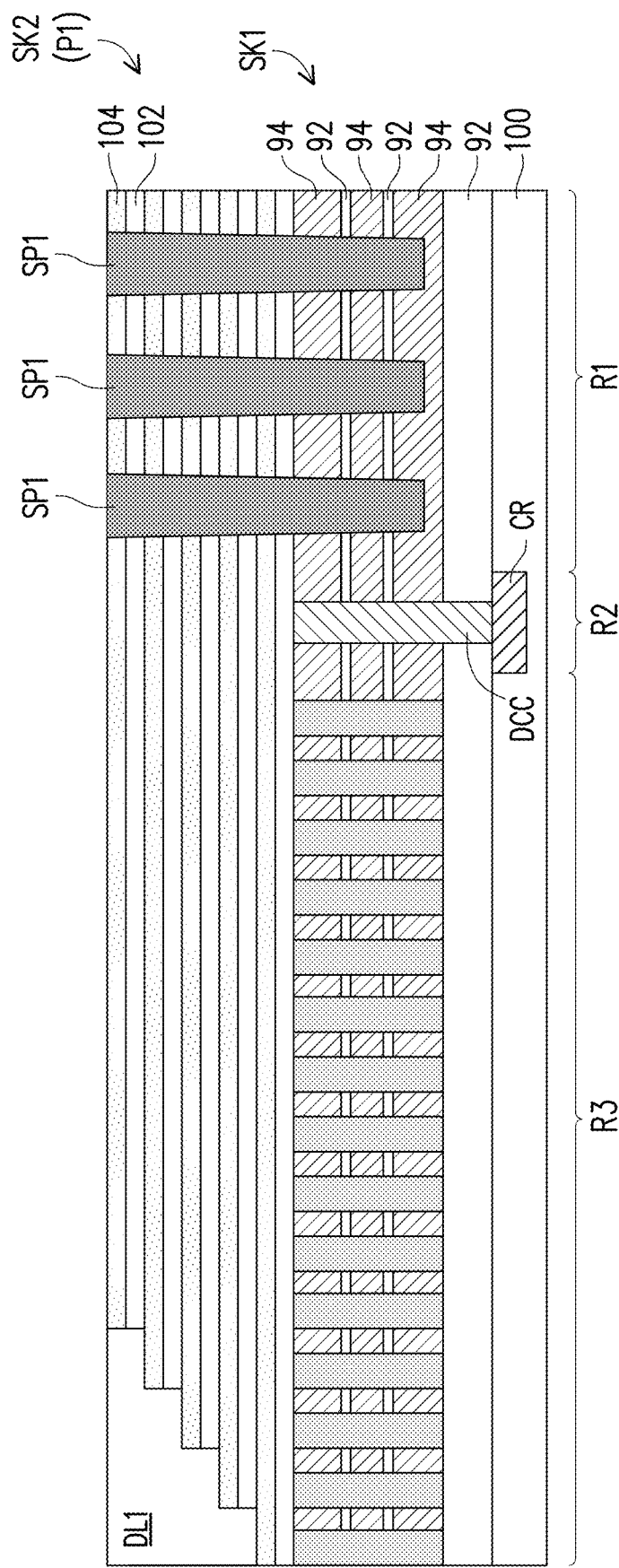
Figure 1F:
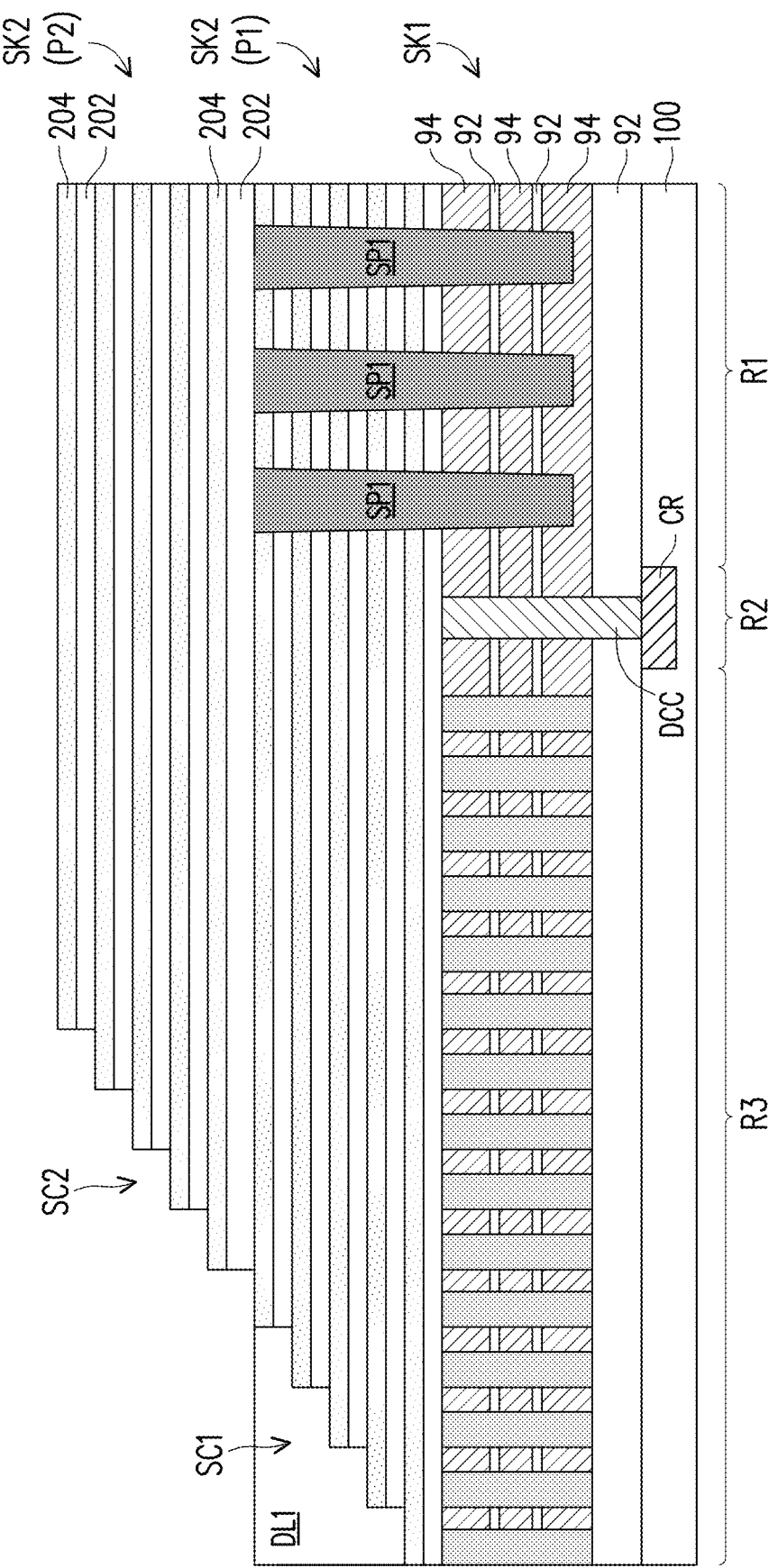
Figure 1G:
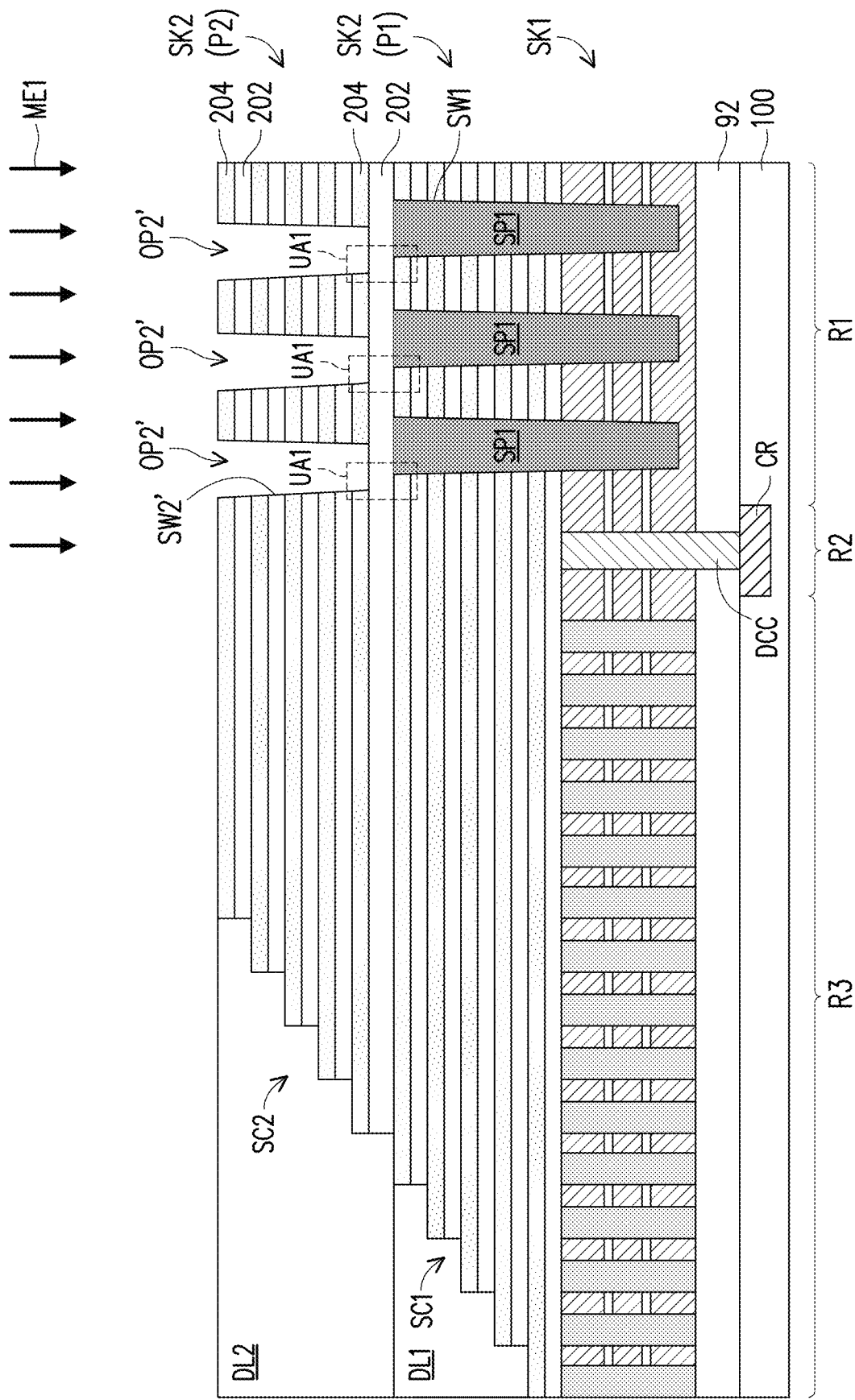
Figure 1H:
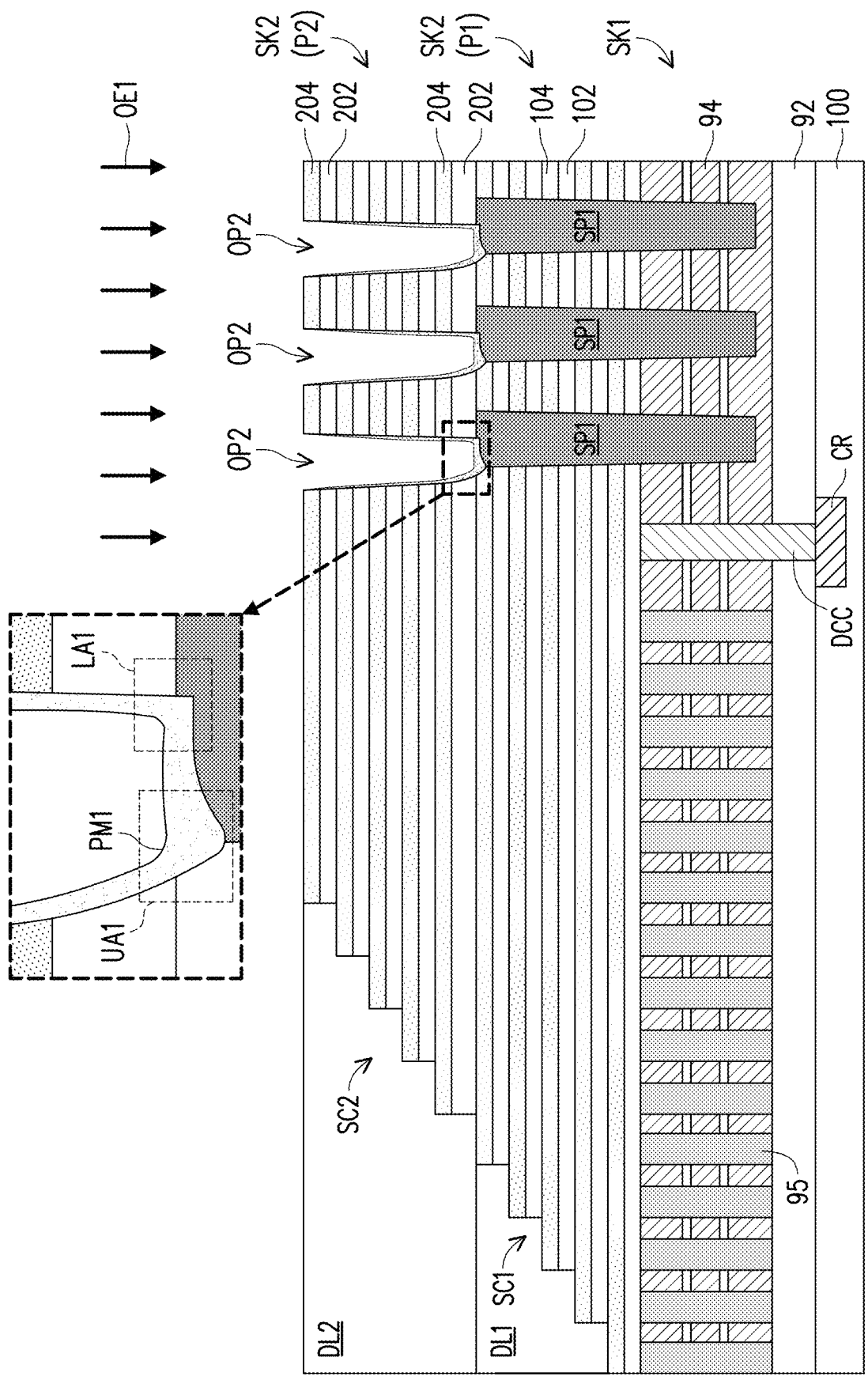
Figure 1I:
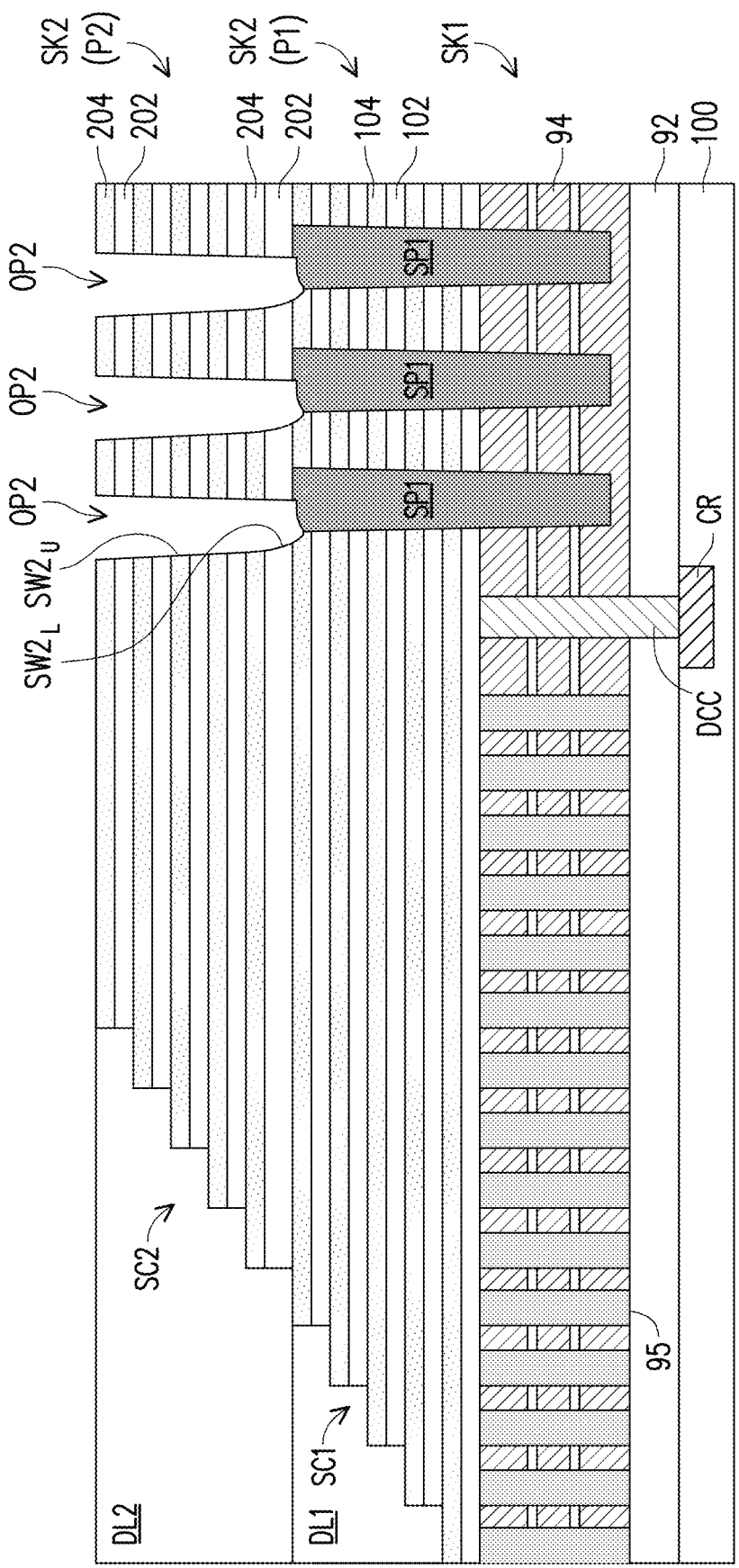
Figure 1J:
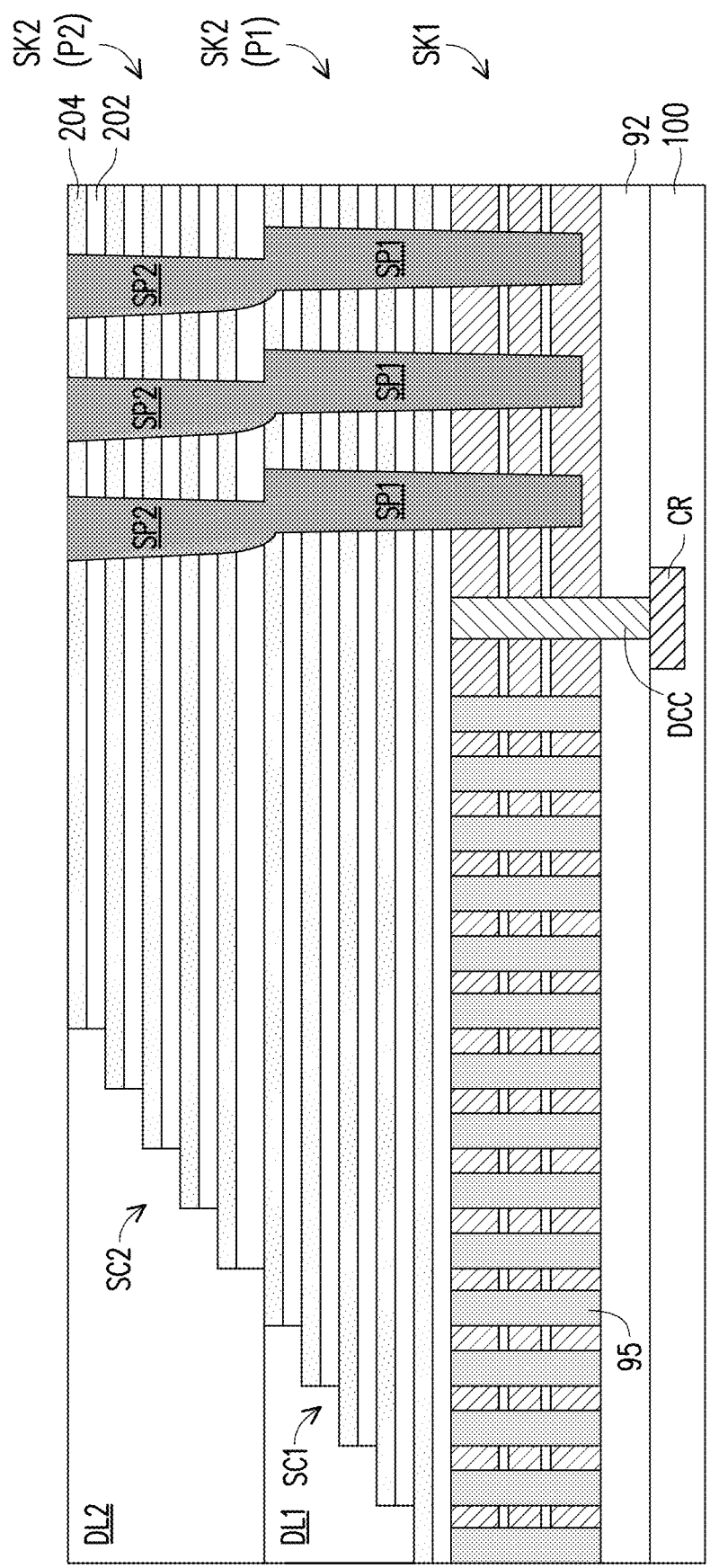
Figure 1K:
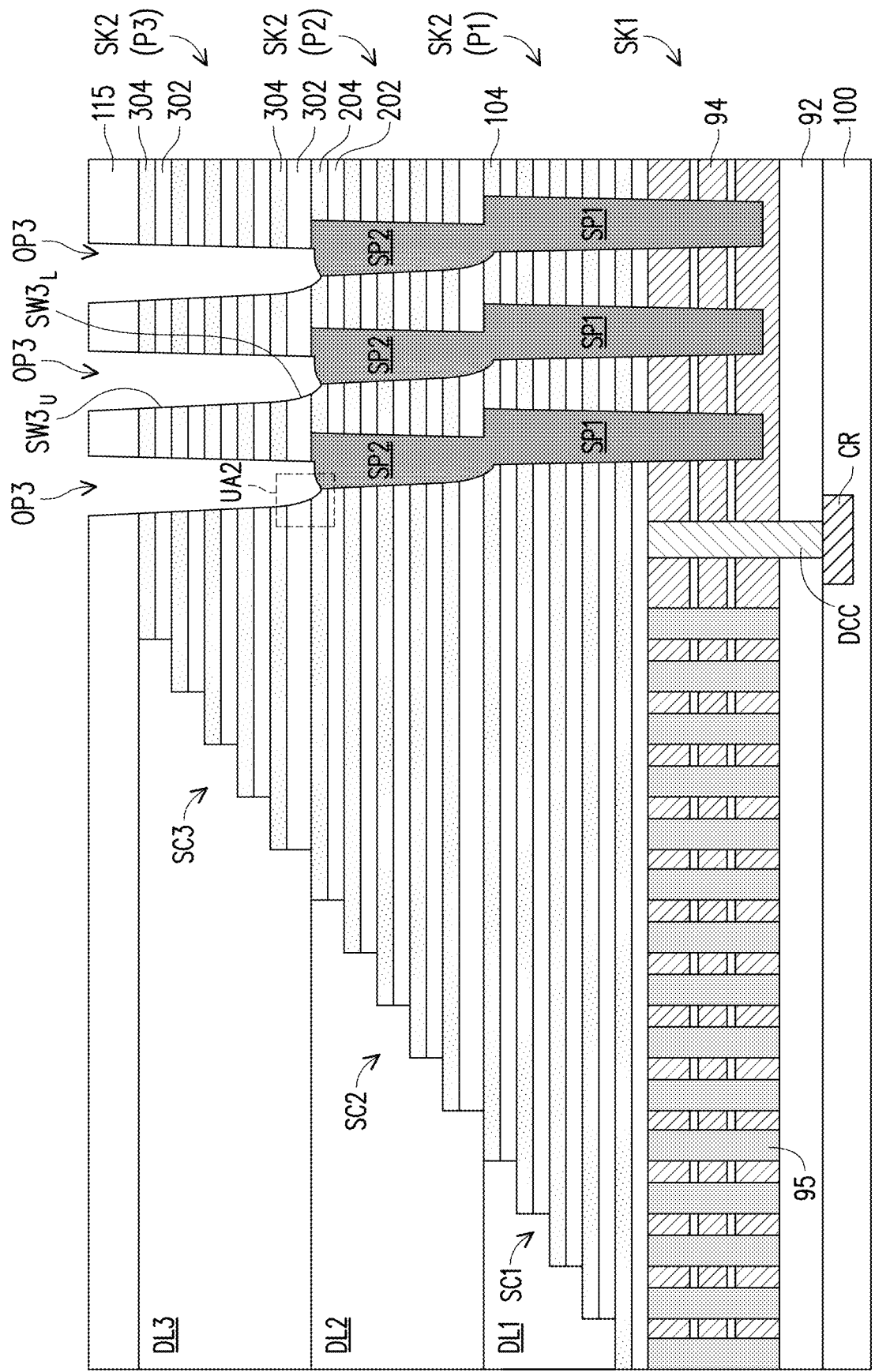
Figure 1L:
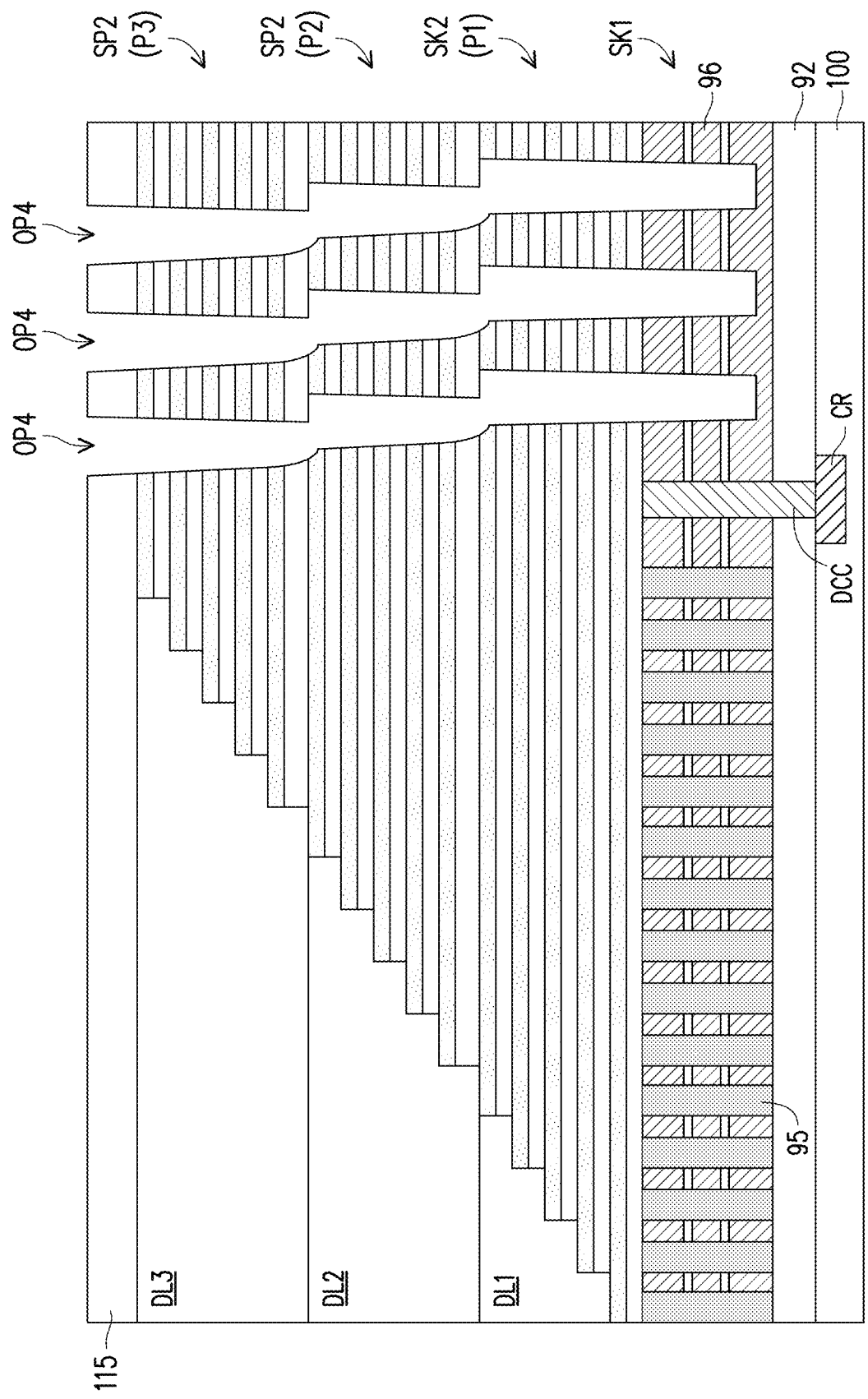
Figure 1M:
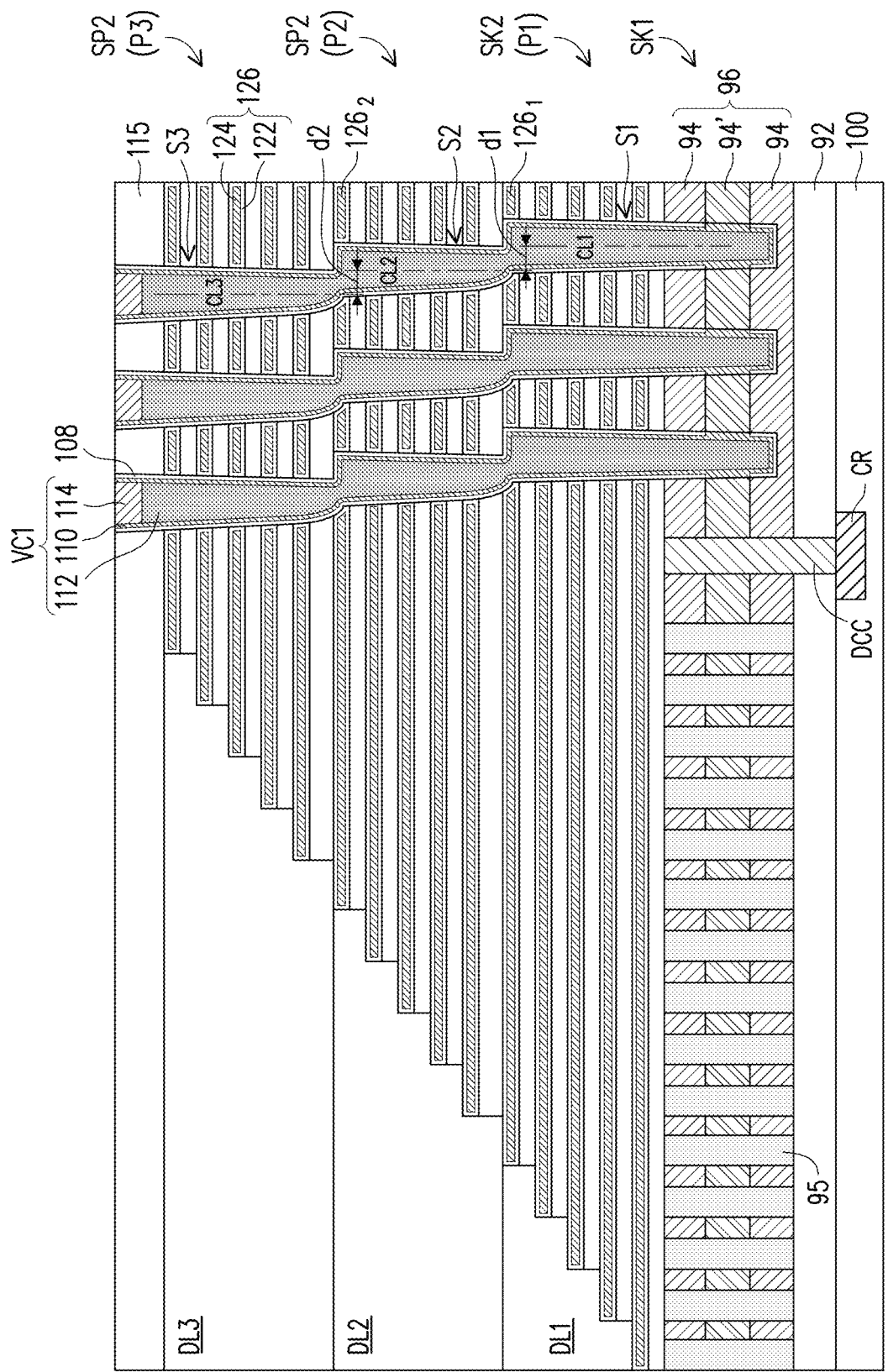
Figure 1N:
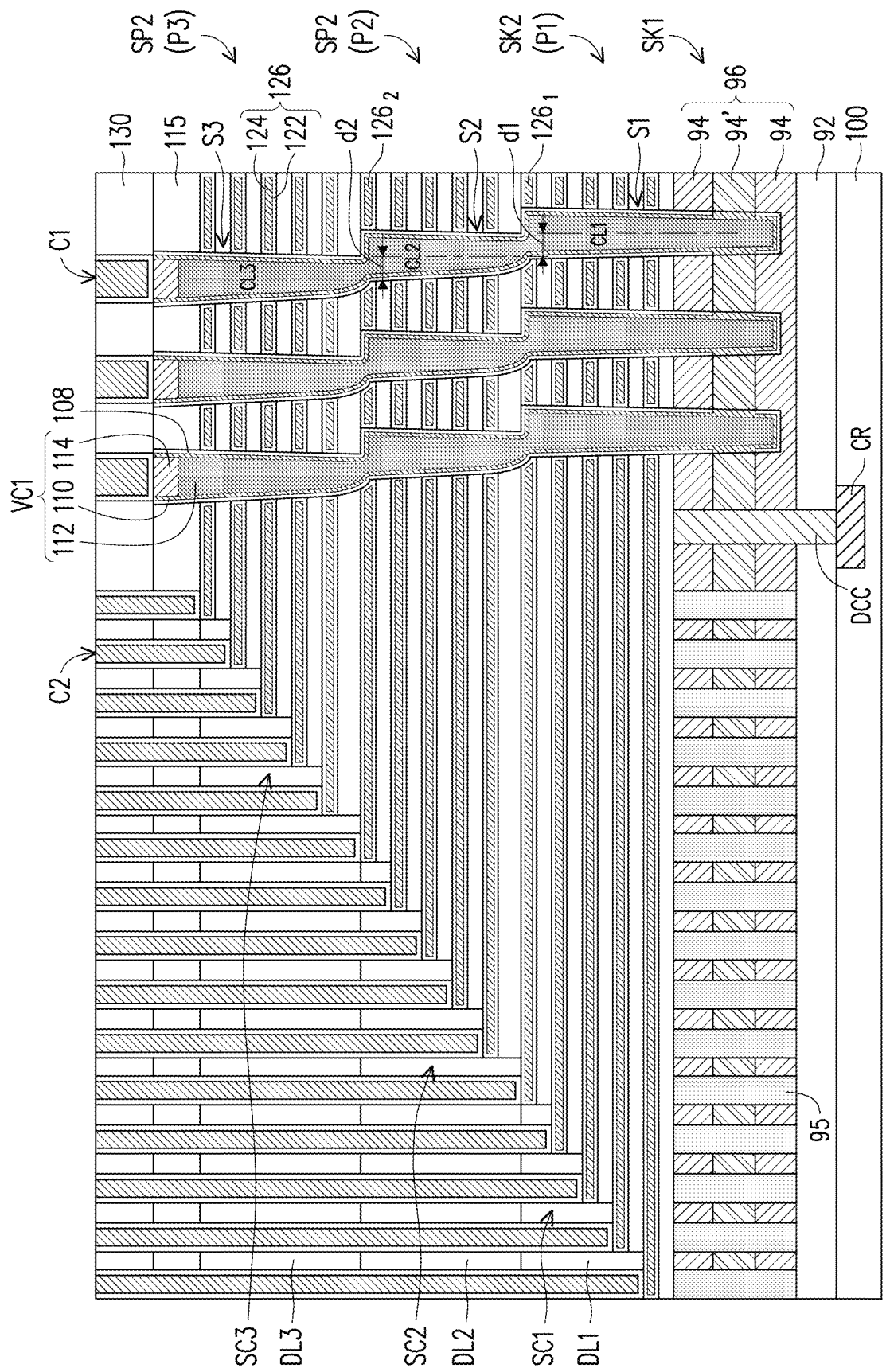
Figure 2B:
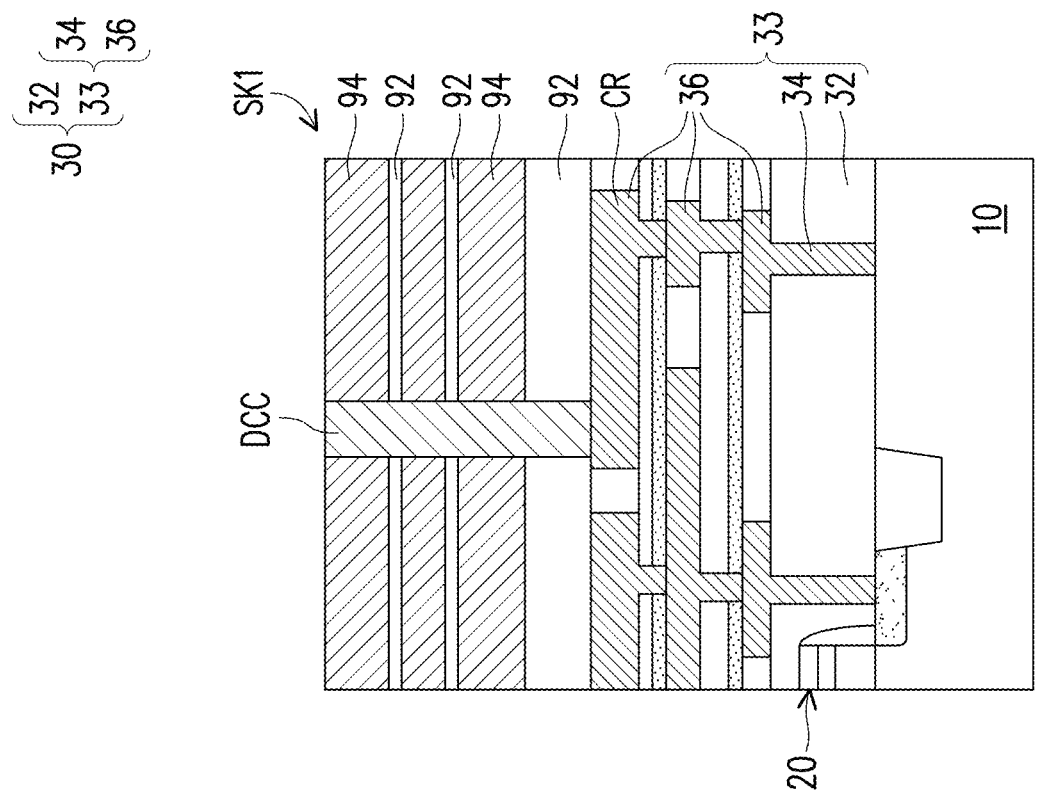
FIG. 2B is a schematic partial cross-sectional view of a three-dimensional memory device according to another embodiment of the disclosure.
Figure 2A:
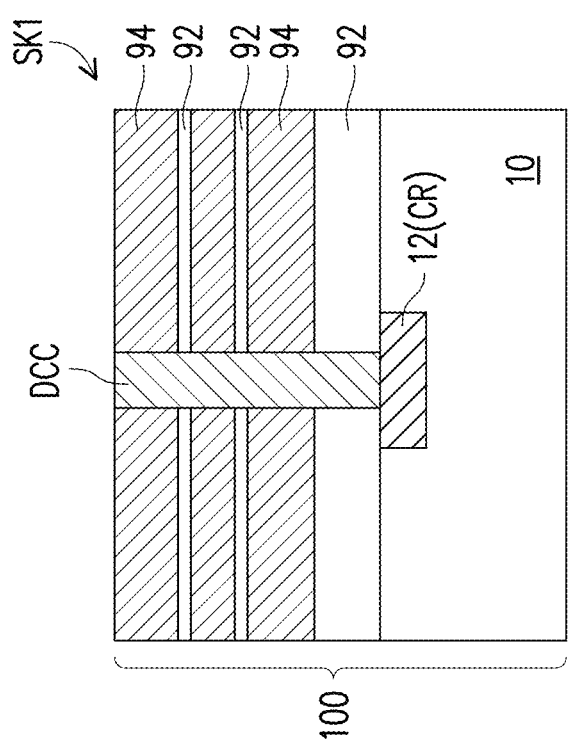
FIG. 2A is a schematic partial cross-sectional view of a three-dimensional memory device according to an embodiment of the disclosure.

FIG. 1A to FIG. 1N are schematic cross-sectional views of a method for manufacturing a three-dimensional memory device according to an embodiment of the disclosure. FIG. 2A is a schematic partial cross-sectional view of a three-dimensional memory device according to an embodiment of the disclosure. FIG. 2B is a schematic partial cross-sectional view of a three-dimensional memory device according to another embodiment of the disclosure.

Referring to FIG. 1A, a substrate 100 is provided, and a stack structure SK1 is formed on the substrate 100. In an embodiment, the substrate 100 has regions R1, R2, and R3, and the region R2 is located between the regions R1 and R3.

The region R1 is also referred to as a cell region 1, the region R2 is also referred to as a transition region, and the region R3 is also referred to as a staircase region. The substrate 100 has a grounded conductive region CR. The conductive region CR may be a semiconductor substrate, a doped region, or a grounded metal interconnect.

Referring to FIG. 2A, in an embodiment, the substrate 100 is a semiconductor substrate 10 such as a silicon-containing substrate, and the conductive region CR may be a doped region 12 in the semiconductor substrate 10. A memory array will be formed right above the stack structure SK1, and a peripheral circuit device such as a complementary metal oxide semiconductor (CMOS) device will be formed in a peripheral circuit region (not shown) of the semiconductor substrate 10 on the lateral side of the memory array and will not be formed below the stack structure SK1.

Referring to FIG. 2B, in another embodiment, the substrate 100 includes a semiconductor substrate 10, a device layer 20, and a metal interconnect structure 30. The device layer 20 may include an active device or a passive device. The active device includes, for example, a transistor, a diode, etc. The passive device includes, for example, a capacitor, an inductor, etc. The transistor may be an N-type metal oxide semiconductor (NMOS) transistor, a P-type metal oxide semiconductor (PMOS) transistor, or a complementary metal oxide semiconductor (CMOS) device. The metal interconnect structure 30 includes a multi-layered dielectric layer 32 and a metal interconnect 33 formed in the multi-layered dielectric layer 32. The metal interconnect 33 includes a plurality of plugs 34, a plurality of conductive lines 36, etc. The dielectric layer 32 separates adjacent conductive lines 36. The conductive lines 36 may be connected to each other via the plugs 34, and the conductive lines 36 may be connected to the device layer 20 via the plugs 34. Since the memory array will be formed right above the stack structure SK1 in the region R1, and the device layer 20 is, for example, a complementary metal oxide semiconductor (CMOS) device formed below the memory array, this structure may also be referred to as a CMOS-under-array (CUA) structure.

Referring to FIG. 1A, the stack structure SK1 includes a plurality of insulating layers 92 and a plurality of conductive layers 94 stacked alternately on each other. In an embodiment, the material of the insulating layer 92 includes silicon oxide, and the material of the conductive layer 94 includes doped polysilicon.

Next, through lithography and etching processes, the stack structure SK1 in the region R3 is patterned to form a plurality of grooves, and a dielectric layer 95 (e.g., silicon oxide) is filled in the grooves. Then, through lithography and etching processes, an opening O1 is formed in the stack structure SK1 in the region R2. The opening O1 is, for example, a hole or a trench. The opening O1 exposes the surface of the conductive region CR. The etching process is, for example, a dry etching process, a wet etching process, or a combination thereof. The shape of the opening O1 may be cylindrical, elliptic cylindrical, cuboidal, etc. and is not specifically limited herein.

Referring to FIG. 1B, a conductive pillar DCC is formed in the opening O1. The conductive pillar DCC has a low resistance, and its resistance is lower than the resistance of the conductive layer 94. In an embodiment, the conductive layer 94 is doped polysilicon, and the conductive pillar DCC is tungsten, titanium nitride, tantalum, or a combination thereof. A method for forming the conductive pillar DCC includes, for example, forming a conductive material on the stack structure SK1 and in the opening O1, and then performing a planarization process such as an etch-back process or a chemical-mechanical polishing process to remove the excess conductive material on the stack structure SK1.

The conductive pillar DCC is electrically connected to the conductive region CR, so the conductive pillar DCC may be grounded to serve as a discharge path. In an embodiment, the conductive pillar DCC is electrically connected to the doped region 12 in the semiconductor substrate 10, as shown in FIG. 2A. In another embodiment, the conductive pillar DCC is electrically connected to the uppermost conductive line 36 of the metal interconnect 33, and the uppermost conductive line 36 is further electrically connected to the substrate 10 to be grounded, as shown in FIG. 2B.

In the embodiment of FIG. 1B, the conductive pillar DCC extends from the top surface of the stack structure SK1 to the bottom surface of the stack structure SK1. However, the embodiment of the disclosure is not limited thereto, and the conductive pillar DCC may extend from any one of the insulating layers 92 or the conductive layers 94 of the stack structure SK1, penetrate through the lowermost insulating layer 92, and extend to the bottom surface of the stack structure SK1 to be electrically connected to the conductive region CR, as shown in FIG. 3A to FIG. 3F.

Figure 3A:
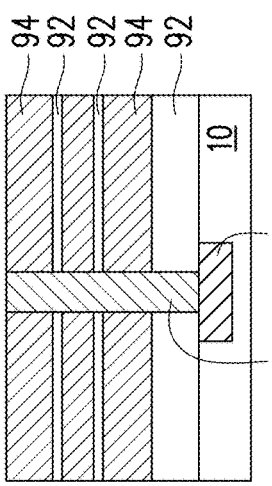
FIG. 3A to FIG. 3F are schematic cross-sectional views of a conductive pillar according to multiple embodiments of the disclosure.
Figure 3B:
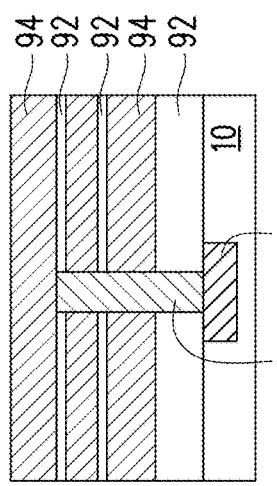
Figure 3C:
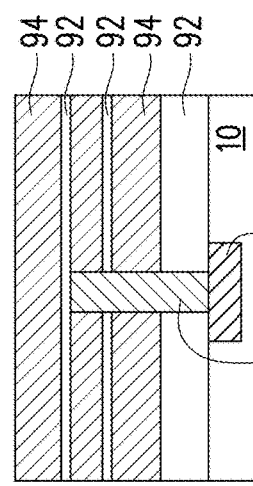
Figure 3D:
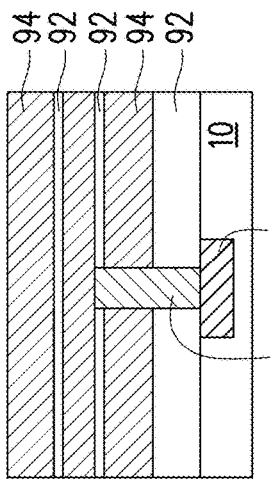
Figure 3E:
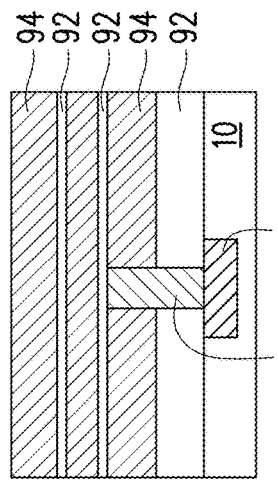
Figure 3F:
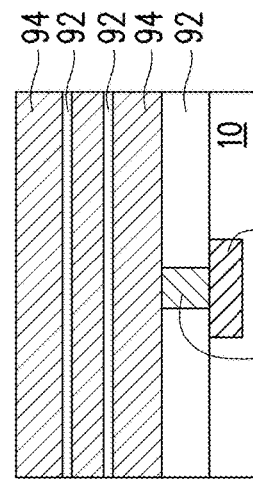
Figure 3G:
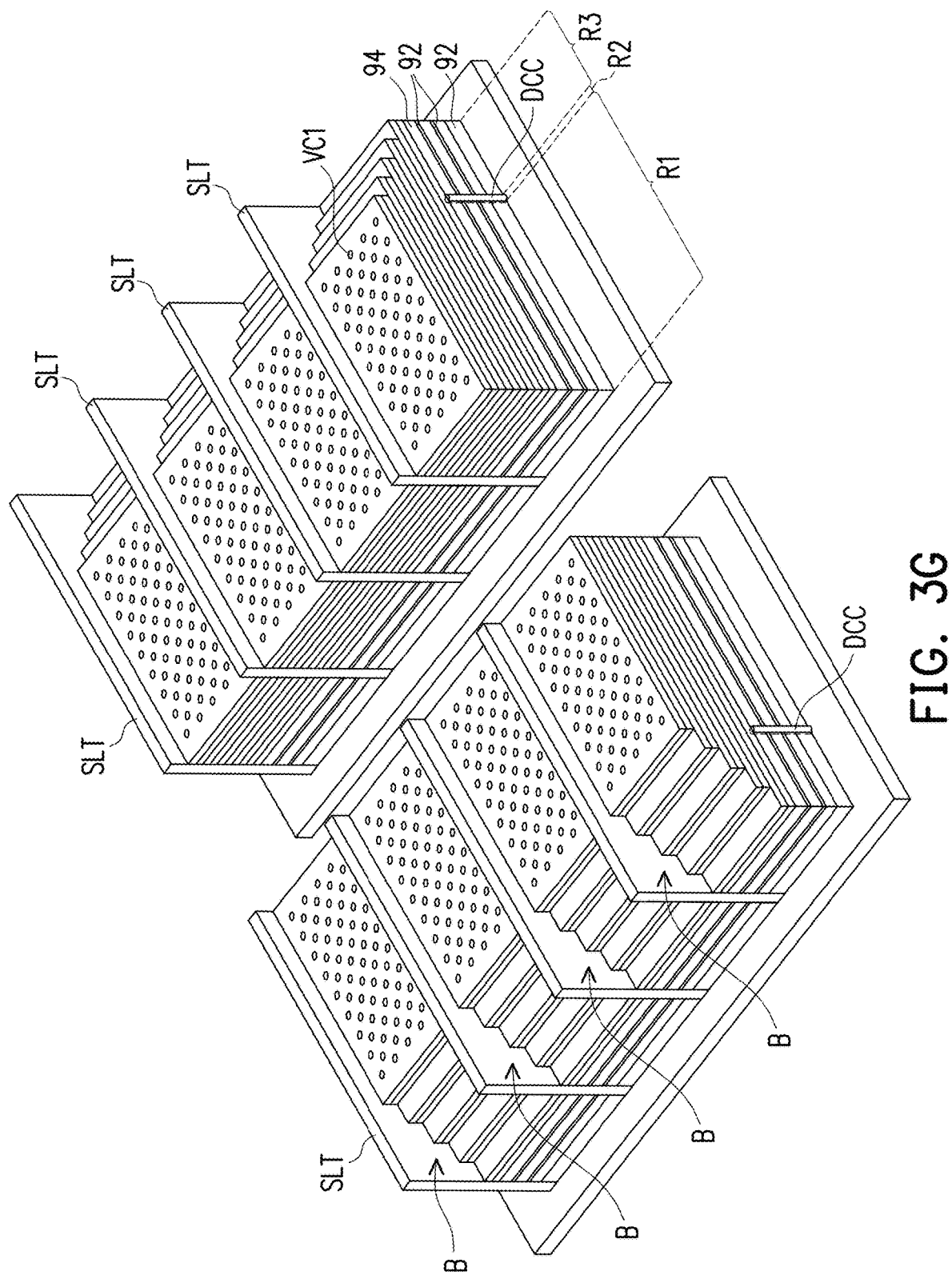
FIG. 3G is a schematic partial perspective view taken along line I-I' of FIG. 1M.

FIG. 3G is a schematic partial perspective view taken along line I-I' of FIG. 1M. For clarity, a dielectric layer DL1 is omitted.

Referring to FIG. 3G, the quantity of the conductive pillars DCC may be determined according to the actual requirements. In some embodiments, each block B is configured to form an array of channel pillars VC1. The arrays of channel pillars VC1 of two adjacent blocks B are separated by a slit SLT. In this embodiment, four blocks B share one conductive pillar DCC, as shown in FIG. 3G. However, the disclosure is not limited thereto, and more or fewer blocks B may share one conductive pillar DCC, or one block may have one or more conductive pillars DCC (not shown).

Referring to FIG. 1C, a first tier (or deck) P1 of a stack structure SK2 is formed on the stack structure SK1. The first tier P1 of the stack structure SK2 includes a plurality of insulating layers 102 and a plurality of sacrificial layers 104 stacked alternately on each other. The insulating layer 102 and the sacrificial layer 104 may also be respectively referred to as a first insulating layer 102 and a second insulating layer 104. In an embodiment, the material of the insulating layer 102 includes silicon oxide, and the material of the sacrificial layer 104 includes silicon nitride.

The first tier P1 of the stack structure SK2 is patterned to form a staircase structure SC1 in the region R3. The staircase structure SC1 may be formed by any known patterning method such as lithography, etching, and trimming processes.

Referring to FIG. 1C, a dielectric layer DL1 is formed on the substrate 100 to cover the staircase structure SC1. The material of the dielectric layer DL1 is silicon oxide, for example. A method for forming the dielectric layer DL1 includes, for example, forming a dielectric material layer, and then performing a planarization process such as an etch-back process or a chemical-mechanical polishing process to remove the excess dielectric material layer on the first tier P1 of the stack structure SK2.

Referring to FIG. 1D, a plurality of openings OP1 are formed in the first tier P1 of the stack structure SK2 and the stack structure SK1. The bottom of the opening OP1 exposes the lowermost conductive layer 94 of the stack structure SK1.

Referring to FIG. 1E, sacrificial pillars SP1 are formed in the openings OP1. The sacrificial pillar SP1 is electrically connected to the conductive region CR of the substrate 100 via the conductive layer 94 and the conductive pillar DCC. The material of the sacrificial pillar SP1 is different from the material of the insulating layer 102. The sacrificial pillar SP1 may be formed of a highly conductive material having a conductivity higher than the conductivity of the sacrificial layer 104. The material of the sacrificial pillar SP1 may be the same as or different from the material of the conductive pillar DCC. The material of the sacrificial pillar SP1 is, for example, tungsten, titanium nitride, tantalum, carbon, doped polysilicon, undoped polysilicon, or a combination thereof. A method for forming the sacrificial pillar SP1 includes, for example, forming a conductive material on the first tier P1 of the stack structure SK2 and in the opening OP1, and then performing a planarization process such as an etch-back process or a chemical-mechanical polishing process to remove the excess conductive material on the first tier P1 of the stack structure SK2.

Referring to FIG. 1F, according to the method for forming the first tier P1 of the stack structure SK2, a second tier P2 of the stack structure SK2 is formed. The second tier P2 of the stack structure SK2 includes a plurality of insulating layers 202 and a plurality of sacrificial layers 204 stacked alternately on each other. In an embodiment, the material of the insulating layer 202 includes silicon oxide, and the material of the sacrificial layer 204 includes silicon nitride. Afterwards, the second tier P2 of the stack structure SK2 in the region R3 is patterned to form a staircase structure SC2.

Referring to FIG. 1G, according to the method for forming the dielectric layer DL1, a dielectric layer DL2 is formed on the substrate 100 to cover the staircase structure SC2. The material of the dielectric layer DL2 is silicon oxide, for example. A method for forming the dielectric layer DL2 includes, for example, forming a dielectric material layer, and then performing a planarization process such as an etch-back process or a chemical-mechanical polishing process to remove the excess dielectric material layer on the second tier P2 of the stack structure SK2.

Referring to FIG. 1G and FIG. 1H, lithography and etching processes are performed to form openings OP2 in the second tier P2 of the stack structure SK2. The etching process is, for example, dry etching, wet etching, or a combination thereof. The dry etching is, for example, plasma etching. The etching process includes a main etching process ME1 and an over-etching process OE1. In some embodiments, the main etching process ME1 may be controlled by a time mode to expose the lowermost insulating layer 202 of the second tier P2 of the stack structure SK2, as shown in FIG. 1G. The over-etching process OE1 may continue to etch the lowermost insulating layer 202 until the sacrificial pillar SP1 is exposed.

However, in some embodiments, misalignment occurs in the lithography process, and as a result, a sidewall SW2' of an opening OP2' formed in the main etching process ME1 deviates from a sidewall SW1 of the corresponding sacrificial pillar SP1, as shown in FIG. 1G. In the subsequent over-etching process, a portion of the formed opening OP2 does not land on the sacrificial pillar SP1, and this area is referred to as an unlanded area UA1. If the etching rate of the unlanded area UA1 is excessively high, multiple sacrificial layers 104 will be etched, which will lead to an electrical problem. In the disclosure, through the arrangement of the conductive pillar DCC and the selection of the etching gas of the over-etching process OE1, it is possible to mitigate or solve the problems of misalignment and an excessively high etching rate of the unlanded area UA1.

In the embodiment of the disclosure, the conductive pillar DCC is grounded and is electrically connected to the sacrificial pillar SP1 via the conductive layer 94. Therefore, in the plasma etching process, the conductive pillar DCC may serve as an antenna to collect charges and guide the plasma ions toward the sacrificial pillar SP1. Therefore, the amount of plasma ions staying in the unlanded area UA1 can be reduced, the etching to the sacrificial layer 204 by the plasma ions can be suppressed, and the formed opening OP2 can be automatically aligned with the sacrificial pillar SP1.

Furthermore, in the embodiment of the disclosure, a second etching gas used in the over-etching process OE1 is different from a first etching gas used in the main etching process ME1. The first etching gas has a first etch selectivity for the insulating layer 202 to the sacrificial layer 204 or 104, the second etching gas has a second etch selectivity for the insulating layer 202 to the sacrificial layer 204 or 104, and the second etch selectivity is greater than the first etch selectivity. The first etch selectivity is, for example, 0.3 to 3, and the second etch selectivity is, for example, 4 to 20. In addition, the second etching gas has a third etch selectivity for the insulating layer 202 to the sacrificial pillar SP1. The third etch selectivity is, for example, greater than 6.5. In an embodiment where the sacrificial pillar SP1 is tungsten and the insulating layer 202 is silicon oxide, the third etch selectivity is greater than 40.

The first etching gas and the second etching gas are both fluorine-containing carbides. A fluorine-to-carbon (F/C) ratio of the first etching gas is a first ratio, a fluorine-to-carbon ratio of the second etching gas is a second ratio, and the second ratio is greater than the first ratio. The second etching gas used in the over-etching process OE1 has a high fluorine-to-carbon (F/C) ratio, so that a by-product PM1 (e.g., fluorocarbon polymer) of a sufficient thickness (a large amount) can be produced in the etching process to cover the bottom of the opening OP2 and protect the uppermost sacrificial layer 104 around the sacrificial pillar SP1. Accordingly, the etching rate of the unlanded area UA1 can be reduced, or the etching of the unlanded area UA1 can even be stopped, while the etching of a landed area LA1 continues. Therefore, etching uniformity of the entire wafer can be ensured.

For example, the first etching gas used in the main etching process ME1 includes a fluorinated hydrocarbon such as $CHF_3$, $CH_2F_2$, $CH_3F$, or a combination thereof. The second etching gas used in the over-etching process OE1 includes a perfluorocarbon $C_xF_y$, where y/x is less than 3. The perfluorocarbon $C_xF_y$ is, for example, $C_4F_6$, $C_4F_8$, $C_5F_8$, $C_3F_8$, or a combination thereof. In some embodiments, the main etching process ME1 uses a fluorinated hydrocarbon such as $CHF_3$, $CH_2F_2$, $CH_3F$, or a combination thereof, the over-etching process OE1 uses a perfluorocarbon $C_xF_y$ such as $C_4F_6$, $C_4F_8$, $C_5F_8$, $C_3F_8$, or a combination thereof, and a hydrocarbon (e.g., $CHF_3$, $CH_2F_2$, $CH_3F$, or a combination thereof) is not used. In other embodiments, the main etching process ME1 uses a fluorinated hydrocarbon such as $CHF_3$, $CH_2F_2$, $CH_3F$, or a combination thereof, the over-etching process OE1 uses a perfluorocarbon $C_xF_y$ such as $C_4F_6$, $C_4F_8$, $C_5F_8$, $C_3F_8$, or a combination thereof, and a fluorinated hydrocarbon (e.g., $CHF_3$, $CH_2F_2$, $CH_3F$, or a combination thereof) is used. However, the content of the fluorinated hydrocarbon used in the over-etching process OE1 is lower than the content used in the main etching process ME1, so as to increase the etch selectivity for the insulating layer 202 to the sacrificial layer 204.

Furthermore, in the over-etching process OE1, diluting the concentration of oxygen or reducing the flow rate of oxygen by a large amount of carrier gas such as Ar can promote the deposition of the by-product (polymer) PM1. In addition, the over-etching process OE1 is performed at a higher pressure such as 20 mTorr to 200 mTorr to promote the deposition of the by-product (e.g., polymer) PM1.

In some exemplary embodiments, the main etching process ME1 includes using 60 sccm to 80 sccm of $CHF_3$, 15 sccm to 25 sccm of $C_4F_8$, 120 sccm to 180 sccm of Ar, and 20 sccm to 24 sccm of $O_2$ at a pressure of 20 mTorr, and the over-etching process OE1 includes using 15 sccm to 20 sccm of $C_4F_6$, 8 sccm to 12 sccm of $C_4F_8$, 600 sccm to 800 sccm of Ar, and 20 sccm to 30 sccm of $O_2$ at a pressure of 30 mTorr.

Referring to FIG. 1I, a cleaning process is performed, for example, by first applying an acid such as Caro's acid ($H_2SO_5$) and then washing with deionized water. At this time, the bottom of the opening OP2 exposes the sacrificial pillar SP1 and the uppermost sacrificial layer 104 around the sacrificial pillar SP1. In other words, the over-etching process OE1 may stop at the uppermost sacrificial layer 104. In the embodiment of the disclosure, due to the arrangement of the conductive pillar DCC and the selection of the etching gas of the over-etching process OE1, the formed opening OP2 is aligned with the sacrificial pillar SP1, and as a result, the profile of an upper sidewall $SW2_U$ of the formed opening OP2 is different from the profile of a lower sidewall $SW2_L$. The profile of the upper sidewall $SW2_U$ is, for example, substantially straight, and the profile of the lower sidewall $SW2_L$ is, for example, curved.

Referring to FIG. 1J, a sacrificial pillar SP2 is formed in the opening OP2. The sacrificial pillar SP2 is electrically connected to the conductive region CR of the substrate 100 via the sacrificial pillar SP1, the conductive layer 94, and the conductive pillar DCC. The material and formation method of the sacrificial pillar SP2 may be the same as the material and formation method of the sacrificial pillar SP1, but the disclosure is not limited thereto.

Referring to FIG. 1K, according to the method for forming the first tier P1 of the stack structure SK2, a third tier P3 of the stack structure SK2 is formed. The third tier P3 of the stack structure SK2 includes a plurality of insulating layers 302 and a plurality of sacrificial layers 304 stacked alternately on each other. In an embodiment, the material of the insulating layer 302 includes silicon oxide, and the material of the sacrificial layer 304 includes silicon nitride. Afterwards, according to the method for forming the staircase structure SC2, the third tier P3 of the stack structure SK2 is patterned to form a staircase structure SC3. Then, according to the method for forming the dielectric layer DL1, a dielectric layer DL3 is formed on the substrate 100.

Next, an insulating cap layer 115 is formed on the third tier P3 of the stack structure SK2 and the dielectric layer DL3. The insulating cap layer 115 is, for example, silicon oxide. Then, a plurality of openings OP3 are formed in the insulating cap layer 115 and the third tier P3 of the stack structure SK2. The opening OP3 may be formed according to the method for forming the opening OP2. Similarly, in the disclosure, through the arrangement of the conductive pillar DCC and the selection of the etching gas of the over-etching process, it is possible to mitigate or solve the problems of misalignment and an excessively high etching rate of an unlanded area UA2. In some embodiments, after a cleaning process is performed after over-etching, the bottom of the opening OP3 exposes the sacrificial pillar SP2 and the uppermost sacrificial layer 204 around the sacrificial pillar SP2. In other words, the over-etching process may stop at the uppermost sacrificial layer 204. In the embodiment of the disclosure, the profile of an upper sidewall $SW3_U$ of the formed opening OP3 is different from the profile of a lower sidewall $SW3_L$. The profile of the upper sidewall $SW3_U$ is, for example, substantially straight, and the profile of the lower sidewall $SW3_L$ is, for example, curved.

Although this embodiment shows, as an example, five layers of each of the insulating layers 102, 202, and 302 and five layers of each of the sacrificial layers 104, 204, and 304, the disclosure is not limited thereto. In addition, although this embodiment describes the stack structure SK2 to have three tiers, i.e., the tiers P1, P2, and P3, the stack structure SK2 may further include one or more tiers located between the first tier P1 and the second tier P2 or between the second tier P2 and the third tier P3 in the disclosure.

Referring to FIG. 1L, an etching process is performed to remove the sacrificial pillars SP1 and SP2, so that the openings OP3, OP2, and OP1 communicate with each other to form a channel opening OP4. Since the materials of the sacrificial pillars SP1 and SP2 are different from the materials of the layers of the stack structures SK1 and SK2, the sacrificial pillars SP1 and SP2 may be removed at a high etch selectivity. The formed channel opening OP4 penetrates through the insulating cap layer 115 and the stack structure SK2, and extends to the stack structure SK1 to expose the lowermost conductive layer 94 of the stack structure SK1.

Referring to FIG. 1M, a storage layer 108 and a channel pillar VC1 are formed in the channel opening OP4. The storage layer 108 surrounds the external surface of the channel pillar VC1. The channel pillar VC1 may be arranged in an array. The channel pillar VC1 may also be referred to as a vertical channel pillar and may be formed by a method described below. The storage layer 108 is formed on the sidewall of the channel opening OP4. In an embodiment, the storage layer 108 is an oxide/nitride/oxide (ONO) composite layer, so the storage layer 108 may also be referred to as a charge storage structure. In an embodiment, the storage layer 108 is formed on the sidewall of the channel opening OP4 in the form of a spacer and exposes the bottom surface of the channel opening OP4. Next, a channel layer 110 is formed on the storage layer 108. In an embodiment, the material of the channel layer 110 includes polysilicon. The channel layer 110 covers the storage layer 108 on the sidewall of the channel opening OP4 and also covers the bottom surface of the channel opening OP4. Next, an insulating pillar 112 is formed in the channel opening OP4. In an embodiment, the material of the insulating pillar 112 includes silicon oxide. Afterwards, a conductive plug 114 is formed on the insulating pillar 112, and the conductive plug 114 is in contact with the channel layer 110. In an embodiment, the material of the conductive plug 114 includes polysilicon. The channel layer 110 and the conductive plug 114 may be collectively referred to as a channel pillar (or referred to as a vertical channel pillar) VC1.

In some embodiments, the channel pillar VC1 has a segmental shape. For example, the channel pillar VC1 includes a first segment S1, a second segment S2, and a third segment S3. Center lines CL1 and CL2 of the first segment S1 and the second segment S2 are not aligned with each other, center lines CL2 and CL3 of the second segment S2 and the third segment S3 are not aligned with each other, and non-zero distances d1 and d2 are respectively present therebetween. In addition, the third segment S3 extends downward until its bottom is surrounded by a gate layer $126_2$, but the bottom surface of the third segment S3 is higher than the bottom surface of the gate layer $126_2$. The second segment S2 extends downward until its bottom is surrounded by a gate layer $126_1$, but the bottom surface of the second segment S2 is higher than the bottom surface of the gate layer $126_1$.

Afterwards, referring to FIG. 1M, a replacement process is performed. The replacement process includes removing the sacrificial layers 104, 204, and 304 of the stack structure SK2 to form horizontal openings (not shown), and filling the horizontal openings with conductive layers. The conductive layer includes, for example, a barrier layer 122 and a metal layer 124. In an embodiment, the material of the barrier layer 122 includes titanium (Ti), titanium nitride (TiN), tantalum (Ta), tantalum nitride (TaN), or a combination thereof, and the material of the metal layer 124 includes tungsten (W). The conductive layer in the horizontal opening serves as a gate layer 126.

Afterwards, referring to FIG. 1M, the middle conductive layer 94 of the stack structure SK1 is removed, and then the insulating layers 92 located above and below the conductive layer 94 are removed to form a horizontal opening (not shown) in the stack structure SK1. Then, a conductive layer 94' is filled in the horizontal opening. The conductive layer 94' in the horizontal opening and the conductive layers 94 above and below the conductive layer 94' collectively form a source line 96. At this time, the channel layer 110 is connected to the source line 96.

Next, referring to FIG. 1N, a dielectric layer 130 is formed on the substrate 100. The dielectric layer 130 is, for example, silicon oxide. Next, a plurality of contacts C1 and C2 are formed. The contact C1 is electrically connected to the conductive plug 114 of the channel pillar VC1. The contact C2 is electrically connected to the ends of the gate layers 126 of the staircase structures SC1, SC2, and SC3 in the region R3. The contacts C1 and C2 may be formed simultaneously or separately. In an embodiment, each of the contacts C1 and C2 may include a barrier layer and a conductive layer. The material of the barrier layer is, for example, titanium (Ti), titanium nitride (TiN), tantalum (Ta), tantalum nitride (TaN), or a combination thereof, and the material of the conductive layer is, for example, tungsten (W).

In the embodiment of the disclosure, the conductive pillar DCC is at a height different from the contacts C1 and C2 and the channel pillar VC1. The top surface of the conductive pillar DCC is lower than the top surfaces of the contacts C1 and C2 and the channel pillar VC1. Moreover, the length of the conductive pillar DCC is less than the length of the channel pillar VC1. The material of the conductive pillar DCC is different from the materials of the channel pillar VC1 and the source line 96. The conductive pillar DCC is buried in the source line 96 and is electrically connected to the source line 96. The conductive pillar DCC is electrically insulated from the gate layer 126 above the conductive pillar DCC by the insulating layer 102, but the conductive pillar DCC penetrates through the insulating layer 92 below the conductive pillar DCC to be connected to the conductive region CR.

The etching gas used to form the opening OP2 in the embodiment of the disclosure is not limited to being used in a three-dimensional memory device having a stack structure SK2 with multiple tiers P1, P2, and P3. Hereinafter, another embodiment will be described with reference to FIG. 4A to FIG. 4G. FIG. 4A to FIG. 4G are schematic cross-sectional views of a method for manufacturing a three-dimensional memory device according to another embodiment of the disclosure.

Referring to FIG. 4A, according to the above method for forming the stack structure SK1, a stack structure SK3 is formed on a substrate 400. The material and structure of the substrate 400 may be the same as or similar to those of the substrate 100. The stack structure SK3 includes a plurality of insulating layers 392 and a plurality of conductive layers 394 which alternate with each other. The material of the insulating layer 392 includes silicon oxide, and the material of the conductive layer 394 includes doped polysilicon.

Afterwards, a stack structure SK4 is formed on the stack structure SK3, and the stack structure SK3 is patterned to form a staircase structure (not shown). The stack structure SK4 includes a plurality of insulating layers 402 and a plurality of sacrificial layers 404 stacked alternately on each other. In an embodiment, the material of the insulating layer 402 includes silicon oxide, and the material of the sacrificial layer 404 includes silicon nitride. FIG. 4A to FIG. 4G show five insulating layers 402 and five sacrificial layers 404 as an example, but the disclosure is not limited thereto. Then, a dielectric layer (not shown) is formed on the staircase structure. The material and formation method of the dielectric layer may be the same as or different from the material and formation method of the dielectric layer DL1. Next, an insulating cap layer 415 is formed on the stack structure SK4 and the dielectric layer on the staircase structure. The insulating cap layer 415 is, for example, silicon oxide. In some embodiments, the insulating cap layer 415 may also be referred to as a top insulating layer 415. Afterwards, lithography and etching processes are performed to form a channel opening OP5 in the stack structure SK4 and the stack structure SK3. The channel opening OP5 exposes the lowermost conductive layer 394 of the stack structure SK3.

Referring to FIG. 4B, a storage layer 408 and a channel pillar VC4 are formed in the channel opening OP5. The storage layer 408 is formed on the sidewall of the channel opening OP5. In an embodiment, the storage layer 408 is a composite layer (ONO) of an oxide 408a, a nitride 408b, and an oxide 408c, so the storage layer 408 may also be referred to as a charge storage structure. The channel pillar VC4 includes a channel layer 410, an insulating pillar 412, and a conductive plug 414. The materials and formation methods of the channel layer 410, the insulating pillar 412, and the conductive plug 414 may be the same as or different from the materials and formation methods of the channel layer 110, the insulating pillar 112, and the conductive plug 114 described above. In some embodiments, the top surfaces of the storage layer 408, the channel pillar VC4, and the top insulating layer 415 are substantially coplanar.

Then, a replacement process is performed. The replacement process includes removing the sacrificial layers 404 of the stack structure SK4 to form horizontal openings (not shown), and filling the horizontal openings with conductive layers to form gate layers 426. The conductive layer serving as the gate layer 426 includes, for example, a barrier layer 422 and a metal layer 424. The materials and formation methods of the barrier layer 422 and the metal layer 424 may be the same as or different from the materials and formation methods of the barrier layer 122 and the metal layer 124.

Afterwards, the middle conductive layer 394 of the stack structure SK3 is removed, and the insulating layers 392 located above and below the conductive layer 394 are removed to form a horizontal opening (not shown) in the stack structure SK3. Then, a conductive layer 394' is filled in the horizontal opening. The conductive layer 394' in the horizontal opening and the conductive layers 394 above and below the conductive layer 394' collectively form a source line 396. At this time, the channel layer 410 is electrically connected to the source line 396.

Figure 4C:
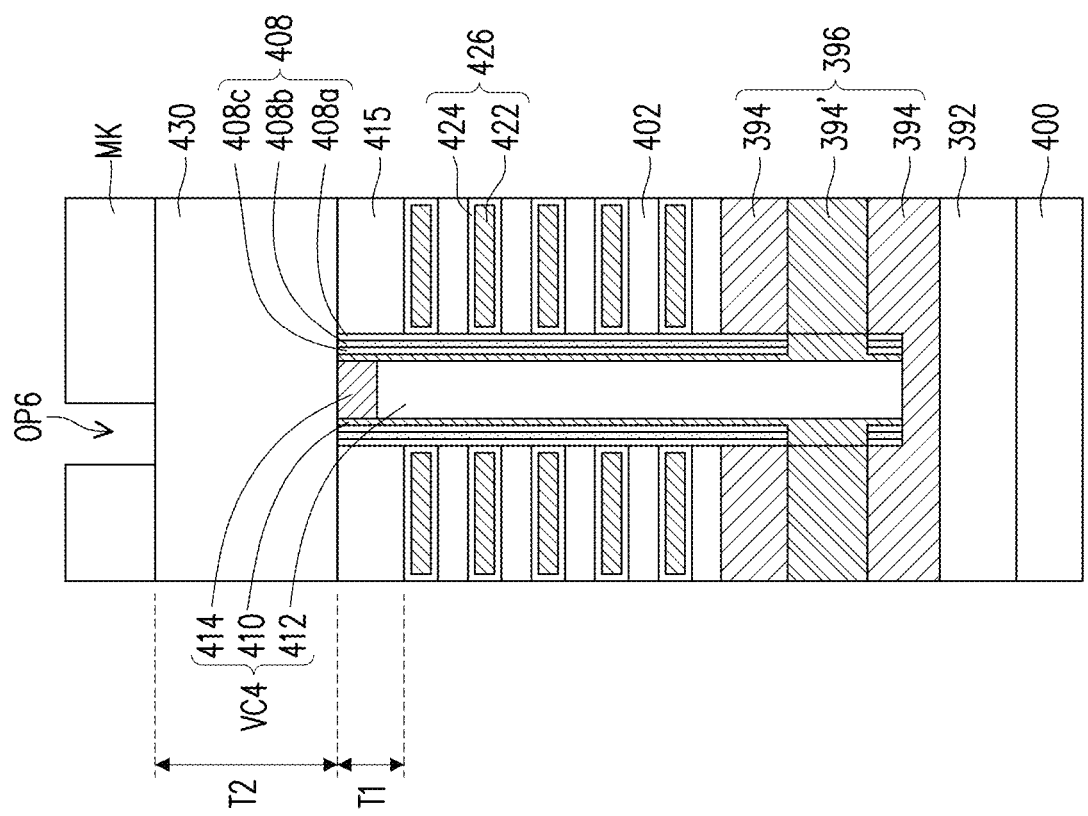

Next, referring to FIG. 4C, a dielectric layer 430 is formed on the substrate 400. The dielectric layer 430 is, for example, silicon oxide. In some embodiments, the dielectric layer 430 does not include an etch stop layer. The etch stop layer is, for example, a silicon nitride layer. A ratio of a thickness T2 of the dielectric layer 430 to a thickness T1 of the top insulating layer 415 is greater than 2, e.g., being 2 to 4, or greater. In some embodiments, the thickness T2 of the dielectric layer 430 is 140 nm to 1000 nm, and the thickness T1 of the top insulating layer 415 is 70 nm to 200 nm.

Figure 5:
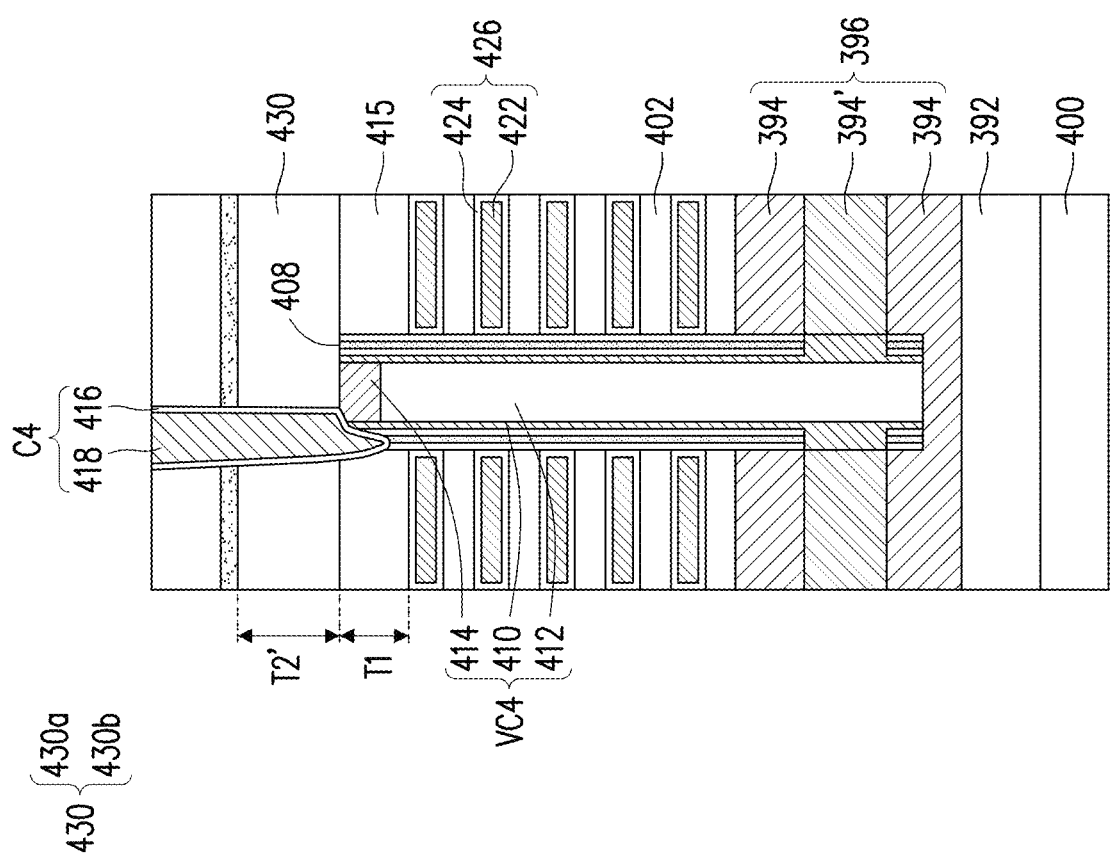
FIG. 5 is a schematic cross-sectional view of another three-dimensional memory device according to an embodiment of the disclosure.

In other embodiments, referring to FIG. 5, the dielectric layer 430 includes an etch stop layer 432. The etch stop layer 432 is located between a dielectric layer 430a and a dielectric layer 430b of the dielectric layer 430. The etch stop layer 432 is, for example, a silicon nitride layer. A ratio of a thickness T2' of the dielectric layer 430a to a thickness T1 of the top insulating layer 415 is greater than 2, e.g., being 2 to 4, or greater. In some embodiments, the thickness T2' of the dielectric layer 430a is 30 nm to 200 nm, and the thickness T1 of the top insulating layer 415 is 70 nm to 200 nm.

Next, referring to FIG. 4C, a hard mask layer MK is formed on the dielectric layer 430. The material of the hard mask layer MK is carbon, for example. The hard mask layer MK is patterned by lithography and etching processes and has a plurality of openings OP6.

Figure 4E:
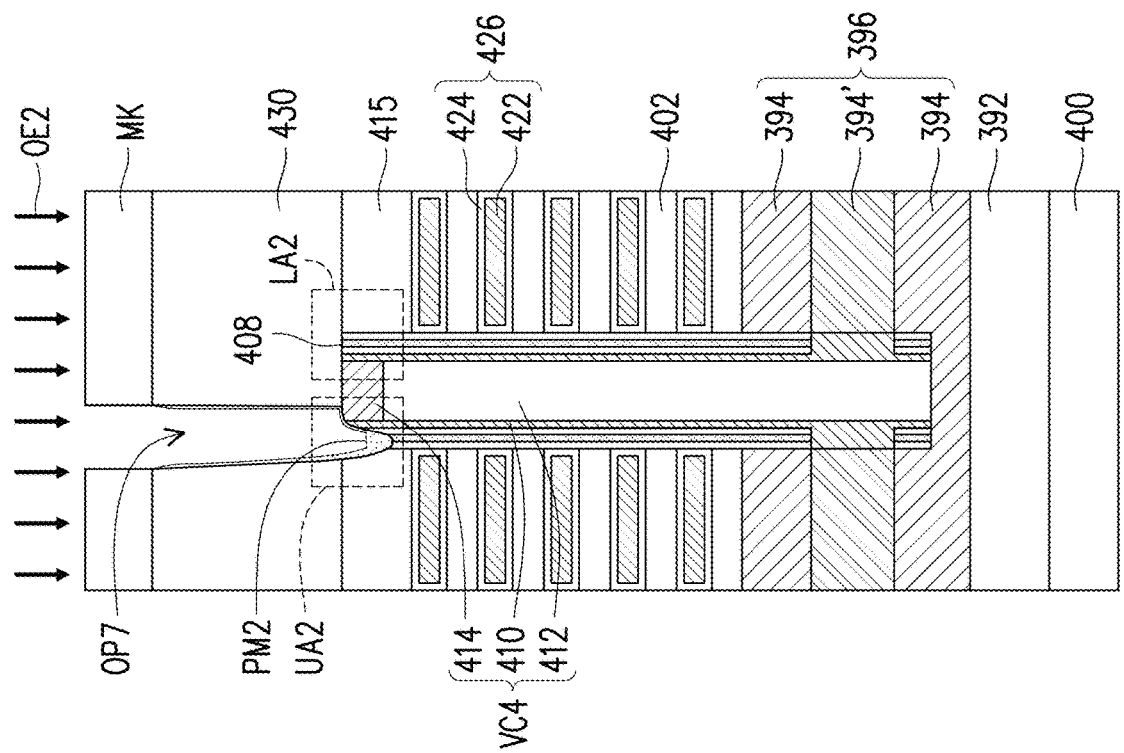
Figure 4D:
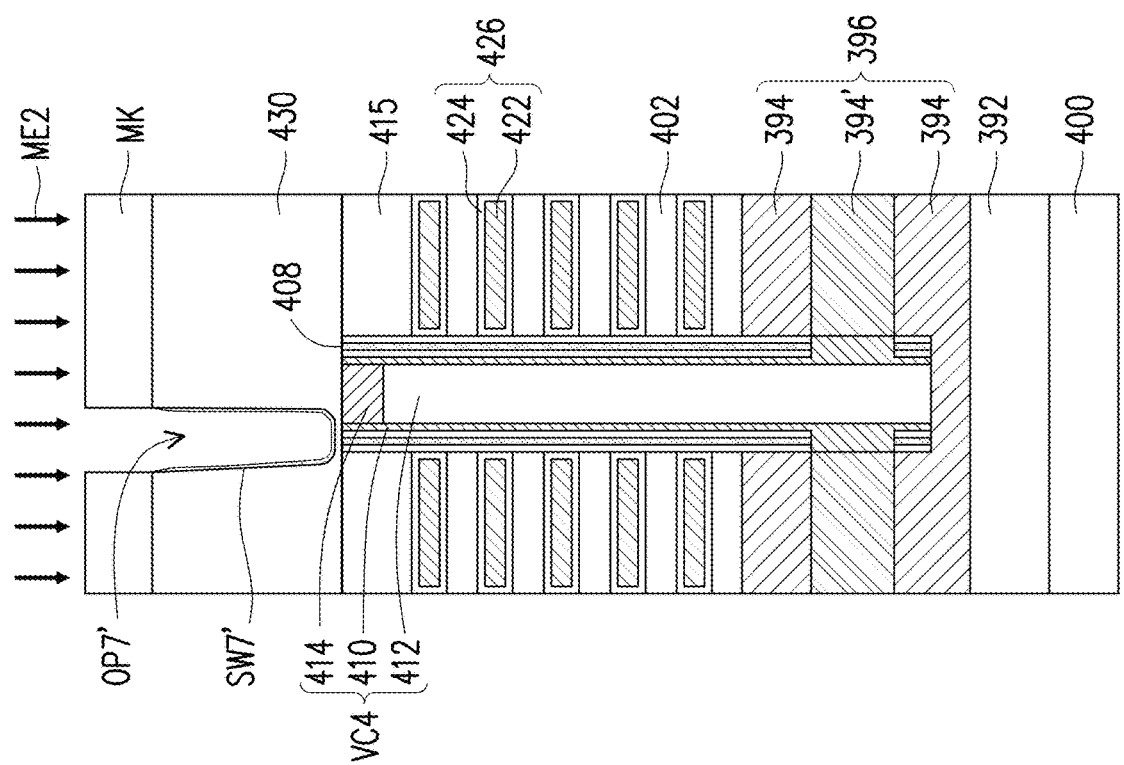

Afterwards, referring to FIG. 4C to FIG. 4E, an etching process is performed to form an opening OP7. The etching process is, for example, dry etching, wet etching, or a combination thereof. The dry etching is, for example, plasma etching. The etching process includes a main etching process ME2 and an over-etching process OE2. In some embodiments, the main etching process ME2 may be controlled by a time mode to remove a portion of the dielectric layer 430, as shown in FIG. 4C. The over-etching process OE2 may continue to etch the remaining dielectric layer 430 until the channel pillar VC4 is exposed.

However, in some embodiments, misalignment occurs in the lithography process, and as a result, a sidewall SW7' of an opening OPT formed in the main etching process ME2 deviates from a sidewall SW6 of the corresponding channel pillar VC4, as shown in FIG. 4D. In the subsequent over-etching process OE2, a portion of the formed opening OP7 does not land on the channel pillar VC4, and this area is referred to as an unlanded area UA2. If the etching rate of the unlanded area UA2 is excessively high, multiple gate layers 426 will be etched, which may lead to an electrical problem. In the disclosure, through the selection of the etching gas of the over-etching process OE2, it is possible to mitigate or solve the problems of misalignment and an excessively high etching rate of the unlanded area UA2.

Referring to FIG. 4E, in the embodiment of the disclosure, a second etching gas used in the over-etching process OE2 is different from a first etching gas used in the main etching process ME2. The first etching gas and the second etching gas are both fluorine-containing carbides. A fluorine-to-carbon (F/C) ratio of the first etching gas is a first ratio, a fluorine-to-carbon ratio of the second etching gas is a second ratio, and the second ratio is greater than the first ratio. The second etching gas used in the over-etching process OE2 has a high fluorine-to-carbon (F/C) ratio, so that a by-product PM2 (e.g., fluorocarbon polymer) of a sufficient thickness (a large amount) can be produced in the etching process to cover the bottom of the opening OP7 and protect the channel layer 410, the storage layer 408, and the top insulating layer 415 around the channel pillar VC4. Accordingly, the etching rate of the unlanded area UA2 can be reduced, or the etching of the unlanded area UA2 can even be stopped, while the etching of a landed area LA2 continues. Therefore, etching uniformity of the entire wafer can be ensured. In some embodiments, the first etching gas used in the main etching process ME2 includes a fluorinated hydrocarbon such as $CHF_3$, $CH_2F_2$, $CH_3F$, or a combination thereof, and the second etching gas used in the over-etching process OE2 includes a perfluorocarbon $C_xF_y$, where y/x is less than 3. The perfluorocarbon $C_xF_y$ is, for example, $C_4F_6$, $C_4F_8$, $C_5F_8$, $C_3F_8$, or a combination thereof. In some embodiments, the main etching process ME2 uses a fluorinated hydrocarbon such as $CHF_3$, $CH_2F_2$, $CH_3F$, or a combination thereof, the over-etching process OE2 uses a perfluorocarbon $C_xF_y$ such as $C_4F_6$, $C_4F_8$, $C_5F_8$, $C_3F_8$, or a combination thereof, and a fluorinated hydrocarbon (e.g., $CHF_3$, $CH_2F_2$, $CH_3F$, or a combination thereof) is not used. In other embodiments, the main etching process ME2 uses a fluorinated hydrocarbon such as $CHF_3$, $CH_2F_2$, $CH_3F$, or a combination thereof, the over-etching process OE2 uses a perfluorocarbon $C_xF_y$ such as $C_4F_6$, $C_4F_8$, $C_5F_8$, $C_3F_8$, or a combination thereof, and a fluorinated hydrocarbon (e.g., $CHF_3$, $CH_2F_2$, $CH_3F$, or a combination thereof) is used. However, the content of the hydrocarbon used in the over-etching process OE2 is lower than the content used in the main etching process ME2.

Furthermore, in the over-etching process OE2, diluting the concentration of oxygen or reducing the flow rate of oxygen by a large amount of carrier gas such as Ar can promote the deposition of the by-product (polymer) PM2. In addition, the over-etching process OE2 is performed at a higher pressure such as 20 mTorr to 200 mTorr to promote the deposition of the by-product (e.g., polymer) PM2.

In some exemplary embodiments, the main etching process ME2 includes using 60 sccm to 80 sccm of $CHF_3$, 15 sccm to 25 sccm of $C_4F_8$, 120 sccm to 180 sccm of Ar, and 20 sccm to 24 sccm of $O_2$ at a pressure of 20 mTorr, and the over-etching process OE2 includes using 15 sccm to 20 sccm of $C_4F_6$, 8 sccm to 12 sccm of $C_4F_8$, 600 sccm to 800 sccm of Ar, and 20 sccm to 30 sccm of $O_2$ at a pressure of 30 mTorr.

Figure 4G:
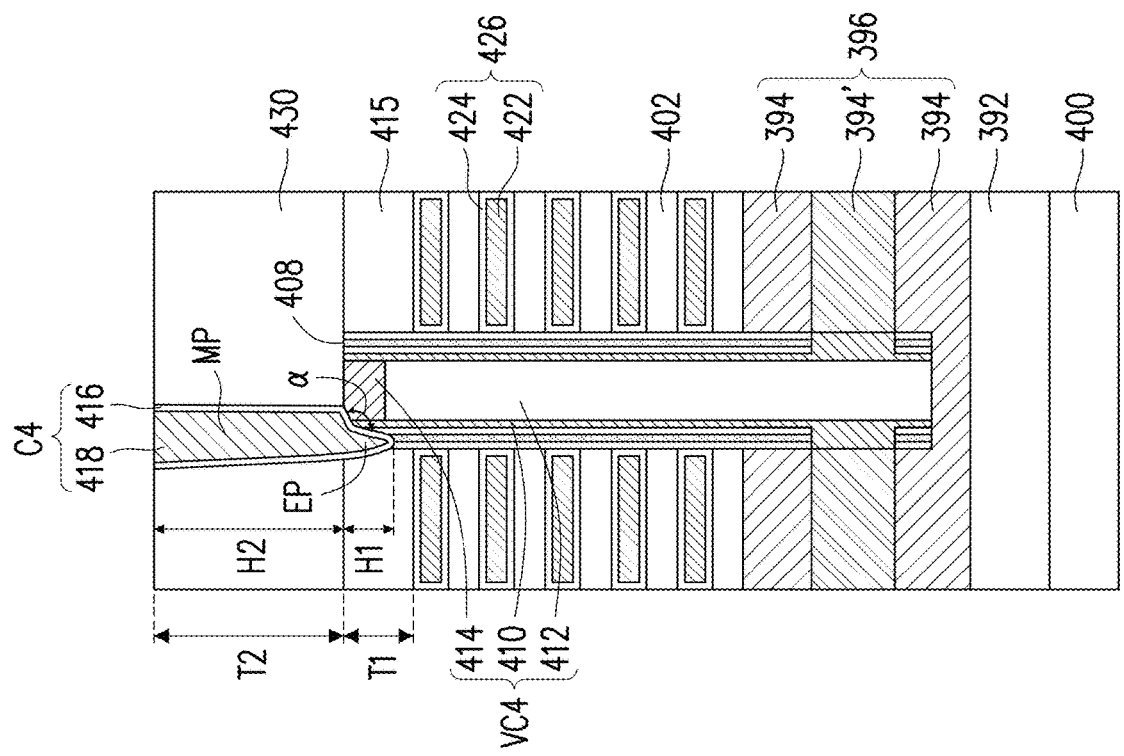
Figure 4F:
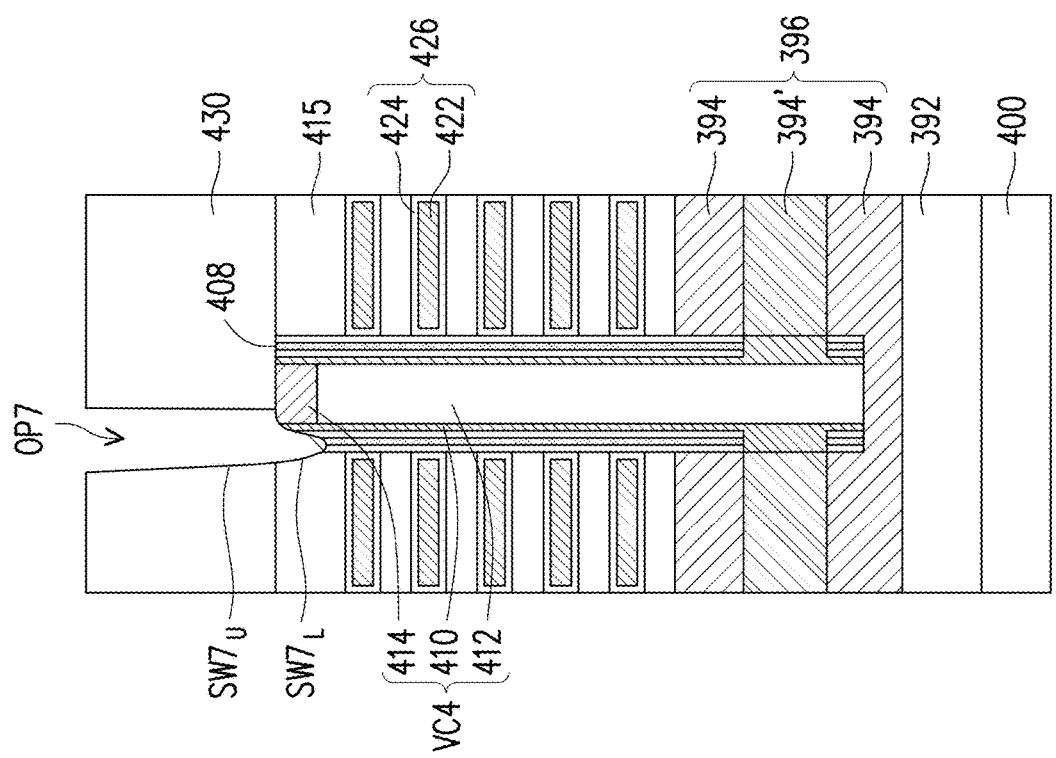

Referring to FIG. 4F, the mask layer MK is removed. The mask layer MK may be removed by ashing, wet etching, or a combination thereof. Afterwards, a cleaning process is performed. After the cleaning process, the bottom of the opening OP7 exposes the channel pillar VC4 and the storage layer 408 and the top insulating layer 415 around the channel pillar VC4. In other words, the over-etching process OE2 may stop at the top insulating layer 415 above the uppermost gate layer 426. In the embodiment of the disclosure, the profile of an upper sidewall $SW7_U$ of the formed opening OP7 is different from the profile of a lower sidewall $SW7_L$. The profile of the upper sidewall $SW7_U$ is substantially straight, and the profile of the lower sidewall $SW7_L$ is curved.

In the over-etching process OE2, since the by-product PM2 covers the bottom of the opening OP7 to protect the channel layer 410, the storage layer 408, and the top insulating layer 415 around the channel pillar VC4, the etching rate of the unlanded area UA2 is reduced, or the etching of the unlanded area UA2 is even stopped, as shown in FIG. 4E. Therefore, in the embodiment of the disclosure, it is not necessary to increase the thickness T1 of the top insulating layer 415 to prevent the uppermost gate layer 426 from being damaged by etching. Accordingly, there may be a greater thickness ratio (T2/T1) between the dielectric layer 430 and the top insulating layer 415.

Next, referring to FIG. 4G, a contact C4 is formed in the contact opening OP7. The contact C4 is electrically connected to the conductive plug 414 of the channel pillar VC4. In an embodiment, the contact C4 may each include a barrier layer 416 and a conductive layer 418. The material of the barrier layer 416 is, for example, titanium (Ti), titanium nitride (TiN), tantalum (Ta), tantalum nitride (TaN), or a combination thereof, and the material of the conductive layer 418 is, for example, tungsten (W).

In some embodiments, the contact C4 covers a vertex a of the conductive plug 414 and is partially buried between the channel pillar VC4 and the storage layer 408. More specifically, the contact C4 includes a body MP and an extension EP. The body MP lands on the top surface of the conductive plug 414, and the sidewall of the body MP is surrounded by the dielectric layer 430. The extension EP is located below the body MP and is connected to the body MP. The extension EP lands on a portion of the storage layer 408. The sidewall of the extension EP is covered by the conductive plug 414 and the storage layer 408. The bottom surface of the extension EP is higher than the top surface of the uppermost gate layer 426. In some embodiments, a height H2 of the body MP is substantially equal to the thickness T2 of the dielectric layer 430, and a height H1 of the extension EP is less than or equal to the thickness T1 of the top insulating layer 415.

In summary of the above, in the embodiments of the disclosure, through the arrangement of the grounded conductive pillar and the selection of the etching gas of the over-etching process, it is possible to mitigate or solve problems such as misalignment and an excessively high etching rate of the unlanded area.

What is claimed is:

1. A memory device comprising:
a first stack structure comprising a first insulating layer and a first conductive layer located on the first insulating layer;
a second stack structure located on the first stack structure and comprising a plurality of second conductive layers and a plurality of second insulating layers which alternate with each other;
a channel pillar penetrating through the second stack structure and extending to the first stack structure;
a storage layer located between the channel pillar and the first stack structure and between the channel pillar and the second stack structure; and
a conductive pillar disposed in the first conductive layer and electrically connected to the first conductive layer and a substrate,
wherein a part of the channel pillar extending to the first stack structure is laterally adjacent to the conductive pillar,
wherein the first stack structure and the channel pillar are disposed over a metal interconnect structure.

2. The memory device according to claim 1, wherein a resistance of the conductive pillar is lower than a resistance of the first conductive layer.

3. The memory device according to claim 1, wherein the conductive pillar is electrically insulated from the plurality of second conductive layers, and penetrates through the first insulating layer so that the conductive pillar is grounded.

4. The memory device according to claim 1, wherein a top surface of the conductive pillar is lower than a top surface of the channel pillar, and a length of the conductive pillar is less than a length of the channel pillar.

5. The memory device according to claim 1, wherein the channel pillar comprises a first segment and a second segment, and a non-zero distance is present between a center line of the first segment and a center line of the second segment.

6. A memory device comprising:
a stack structure located on a substrate and comprising a plurality of conductive layers and a plurality of insulating layers which alternate with each other;
a top insulating layer located on the stack structure;
a channel pillar located in the top insulating layer and the stack structure;
a storage layer located between the channel pillar and the plurality of conductive layers;
a dielectric layer located on the top insulating layer; and
a contact penetrating through the dielectric layer and the top insulating layer and electrically connected to the channel pillar,
wherein a ratio of a thickness of the dielectric layer to a thickness of the top insulating layer is greater than 2,
wherein a part of the channel pillar extending to the stack structure is laterally adjacent to the conductive pillar,
wherein the stack structure and the channel pillar are disposed over a metal interconnect structure.

7. The memory device according to claim 6, wherein a bottommost surface of the contact is higher than a top surface of a top conductive layer of the stack structure.

8. The memory device according to claim 7, wherein the contact comprises:
a body landing on the channel pillar, wherein a sidewall of the body is surrounded by the dielectric layer; and
an extension located below the body and landing on a portion of the storage layer, wherein a sidewall of the extension is covered by the storage layer and the channel pillar.

9. The memory device according to claim 6, wherein there is no etch stop layer in the dielectric layer.

* * * * *